(12) United States Patent
Singer et al.

(10) Patent No.: US 12,165,959 B2
(45) Date of Patent: Dec. 10, 2024

(54) LEADFRAME, ENCAPSULATED PACKAGE WITH PUNCHED LEAD AND SAWN SIDE FLANKS, AND CORRESPONDING MANUFACTURING METHOD

(71) Applicant: Infineon Technologies AG, Neubiberg (DE)

(72) Inventors: Frank Singer, Regenstauf (DE); Marcus Boehm, Thalmassing (DE); Andreas Grassmann, Regensburg (DE); Martin Gruber, Schwandorf (DE); Uwe Schindler, Reichenbach (DE)

(73) Assignee: Infineon Technologies AG, Neubiberg (DE)

( * ) Notice: Subject to any disclaimer, the term of this patent is extended or adjusted under 35 U.S.C. 154(b) by 347 days.

(21) Appl. No.: 17/150,739

(22) Filed: Jan. 15, 2021

(65) Prior Publication Data
US 2021/0225744 A1    Jul. 22, 2021

(30) Foreign Application Priority Data
Jan. 17, 2020   (DE) .......................... 102020101098.2

(51) Int. Cl.
| | |
|---|---|
| *H01L 23/495* | (2006.01) |
| *H01L 21/48* | (2006.01) |
| *H01L 21/56* | (2006.01) |
| *H01L 23/31* | (2006.01) |

(52) U.S. Cl.
CPC .... *H01L 23/49565* (2013.01); *H01L 21/4825* (2013.01); *H01L 21/4842* (2013.01); *H01L 21/565* (2013.01); *H01L 23/3107* (2013.01); *H01L 23/4952* (2013.01); *H01L 23/49524* (2013.01); *H01L 23/49575* (2013.01)

(58) Field of Classification Search
CPC .......... H01L 23/49565; H01L 21/4825; H01L 21/4842; H01L 21/565; H01L 23/3107; H01L 23/49524; H01L 23/49575; H01L 21/561; H01L 23/49548; H01L 23/49562; H01L 21/56; H01L 23/49541
USPC ......................................................... 257/670
See application file for complete search history.

(56) References Cited

U.S. PATENT DOCUMENTS

| | | |
|---|---|---|
| 6,483,180 B1 | 11/2002 | Bayan et al. |
| 2007/0034994 A1 | 2/2007 | Choi |
| 2008/0096319 A1* | 4/2008 | Hwa ........................ H01L 24/97 257/E23.044 |
| 2009/0026590 A1 | 1/2009 | Lim et al. |
| 2011/0065240 A1 | 3/2011 | Gao et al. |
| 2013/0001761 A1 | 1/2013 | Rogren |
| 2015/0325503 A1* | 11/2015 | Lay Yeap ................ H01L 24/97 438/15 |

(Continued)

FOREIGN PATENT DOCUMENTS

WO    2014049059 A2    4/2014

*Primary Examiner* — Kimberly N Rizkallah
*Assistant Examiner* — Dilinh P Nguyen
(74) *Attorney, Agent, or Firm* — Murphy, Bilak & Homiller, PLLC

(57) ABSTRACT

A package includes a carrier, an electronic component on the carrier, an encapsulant encapsulating at least part of the carrier and the electronic component, and at least one lead extending beyond the encapsulant and having a punched (Continued)

surface, wherein at least part of at least one side flank of the encapsulant has a sawn texture.

8 Claims, 14 Drawing Sheets

(56)  References Cited

U.S. PATENT DOCUMENTS

2015/0332989 A1   11/2015   Samson et al.

\* cited by examiner

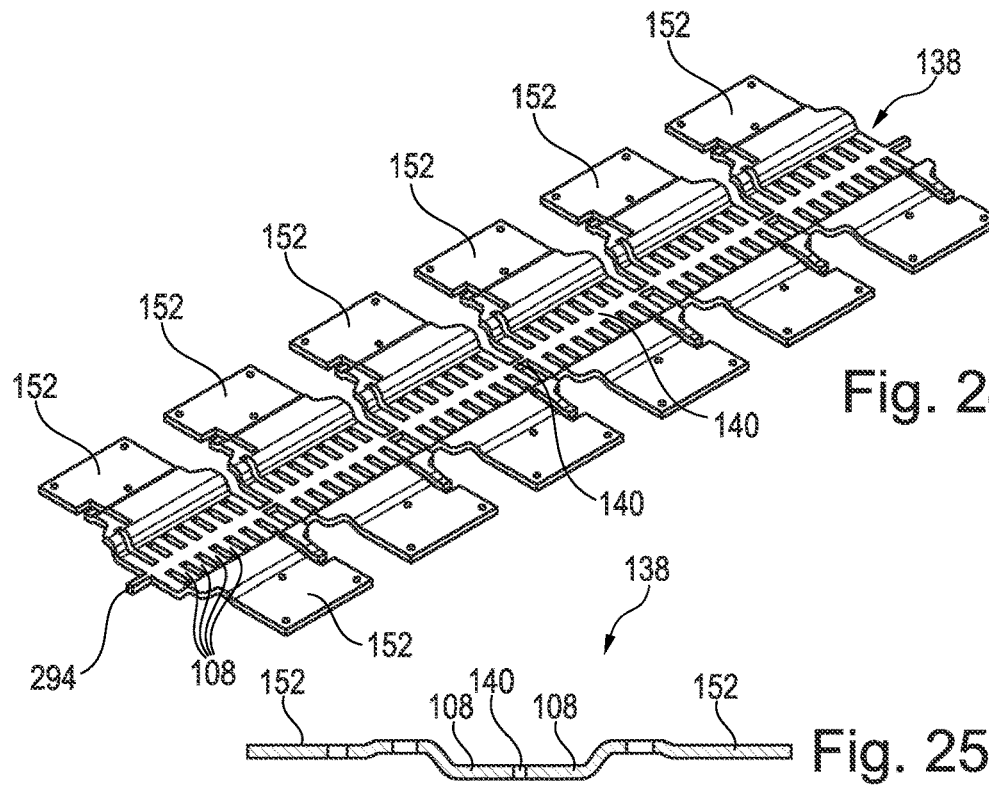
Fig. 24
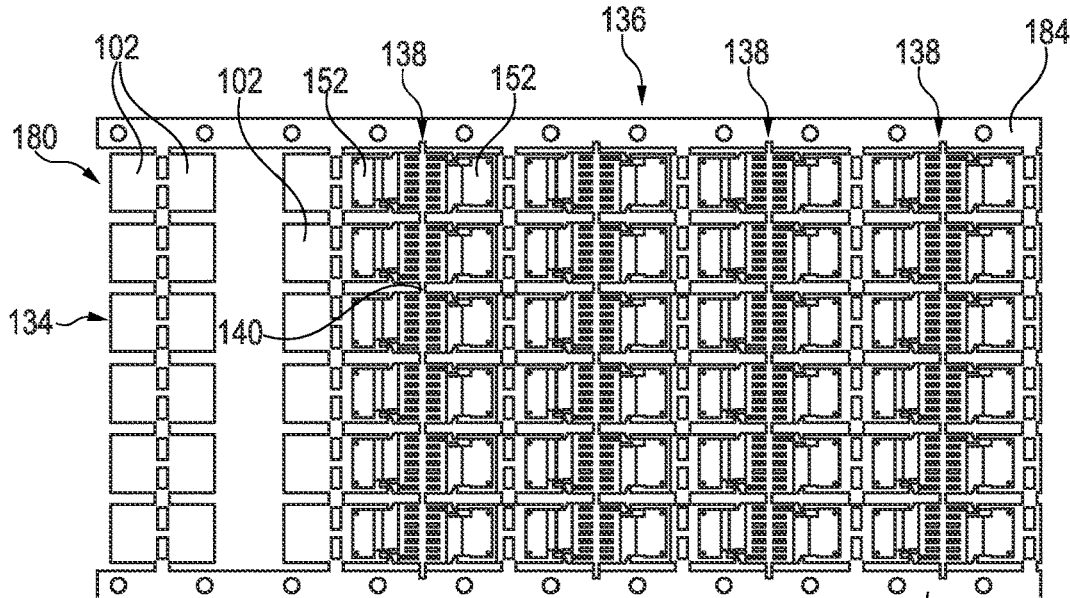
Fig. 25
Fig. 26
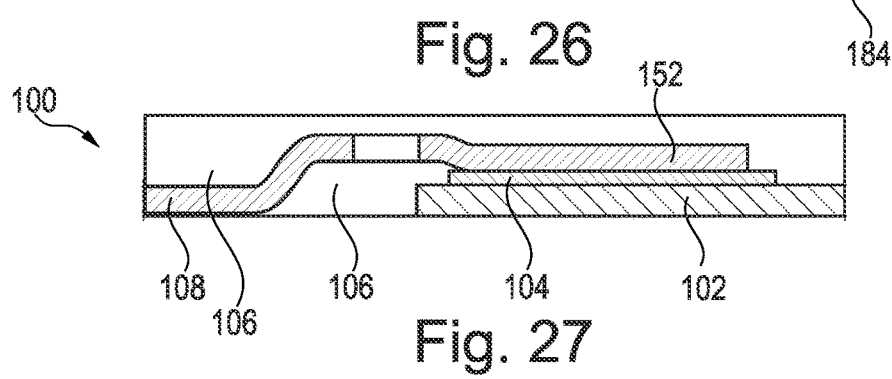
Fig. 27

LEADFRAME, ENCAPSULATED PACKAGE WITH PUNCHED LEAD AND SAWN SIDE FLANKS, AND CORRESPONDING MANUFACTURING METHOD

TECHNICAL FIELD

Various embodiments relate generally to a package, a leadframe, and a method of manufacturing a package.

DESCRIPTION OF THE RELATED ART

Packages may be denoted as encapsulated electronic components with electrical connections extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application.

SUMMARY

There may be a need to provide a possibility to manufacture packages with the focus to reduce processing complexity while maintaining high device reliability.

According to an exemplary embodiment, a package is provided which comprises a carrier, an electronic component on the carrier, an encapsulant encapsulating at least part of the carrier and the electronic component, and at least one lead extending beyond the encapsulant and having a punched surface, wherein at least part of at least one side flank of the encapsulant has a sawn texture.

According to another exemplary embodiment, a method of manufacturing a package is provided, wherein the method comprises mounting an electronic component on a carrier, encapsulating at least part of the carrier and the electronic component by an encapsulant, punching at least one lead extending beyond the encapsulant, and sawing at least part of at least one side flank of the encapsulant.

According to still another exemplary embodiment, a leadframe concept is provided which comprises a patterned electrically conductive sheet, a plurality of carriers defined within the sheet and being arranged in rows and columns, and at least one lead assigned to each of the carriers, wherein the sheet has a larger extension along the rows as compared to a smaller extension along the columns, and wherein the leads extend along the rows.

According to an exemplary embodiment, an encapsulated (in particular molded) package is provided which has at least one sawn side flank (in particular two opposing sawn side flanks on opposing sides of the encapsulant) and at least one further side flank (in particular two opposing further side flanks on opposing sides of the encapsulant and being different from the one or more sawn side flanks) with one or more leads being punched. The characteristics of the at least one further side flank may be defined by an encapsulation process, in particular by molding.

According to an exemplary embodiment, a package with an encapsulated electronic component mounted on a carrier is provided, wherein a part of the exterior outline of the package is defined by sawing (in particular by mechanically sawing), whereas another portion of the outline is defined by punching. A corresponding manufacturing process flow may be highly efficient since it may encapsulate a plurality of carriers with mounted electronic components by a spatially extended (in particular bar-shaped) encapsulant before separating said common encapsulant structure by sawing into individual encapsulants of the individual packages. In a direction perpendicular to an extension of such a common encapsulant body, one or more leads may extend from one or two opposing sides of the encapsulant assigned to a respective package which may be separated by punching. Thus, an efficient multi-package encapsulation and an efficient singularization by high-speed sawing may be combined with a quick and simple singularization in the orthogonal direction by punching.

The described manufacturing process flow, which allows manufacturing packages at higher resource usage efficiency, can be carried out advantageously using a leadframe according to an exemplary embodiment. In order to support the above-described manufacturing process flow, such a leadframe may orient the leads assigned to the various carriers to extend from a short side and parallel to a long side of the carriers. In contrast to conventional approaches, the individual carriers may be arranged, descriptively speaking, 90° rotated within the framework of the leadframe. This may ensure compatibility with the formation of a common encapsulant bar or the like extending along the shorter sides of the carriers and along a shorter side of the leadframe, since a common encapsulation along the longer side of the leadframe may be technologically more difficult. Correspondingly, sawing may be accomplished along the longer side of the carriers and the leadframe. Sawing may be carried out in accordance with a copper-poor or even copper-less sawing trajectory and thereby predominantly or entirely through encapsulant material, which may allow high-speed sawing. Punching, on the other hand, may be carried out along the shorter side of the leadframe, and therefore also highly efficiently. Concluding, packages may be manufactured on the basis of the described leadframe concept by carrying out simple and material-saving manufacturing methods according to an exemplary embodiment.

In an embodiment, the at least one sawn side flank is defined, in particular exclusively, by the encapsulant. In such an embodiment, sawing of said side flank (s) may be carried out exclusively through encapsulant material, in particular mold compound material. Since metal sawing may be completely avoided in such an embodiment, a high-speed sawing and thereby efficient processing can be ensured.

In another embodiment, the at least one sawn side flank is defined, in particular exclusively, by the encapsulant and a (in particular metallic) tie bar connected to the carrier. Such a tie bar may be used for integrally connecting various carriers in the leadframe compound prior to singularization into packages. In particular, a ratio between a surface area of an exposed tie bar at a respective sawn side flank and an entire surface area of the respective sawn side flank may be less than 10%, in particular less than 5%, more particularly less than 3%. In such an alternative embodiment, sawing is carried out through material of the (in particular mold-type) encapsulant in combination with only a very limited amount of material of the metallic tie bar(s). Said highly limited tie bar sawing may saw through only a few percent surface area of metal material which maintains the advantage of high-speed sawing substantially through encapsulant material. At the same time, said tie bar may connect different carriers of a leadframe and may thereby increase the mechanical stability during manufacture. As a accurate consequence, highly packages may be obtained.

In an embodiment, the tie bar has a thicker portion within the encapsulant as compared to a thinner portion at the respective sawn side flank. The amount or percentage of metal material which is sawn during the singularization process of the packages may be further reduced by locally thinning the tie bar sections in the regions of the processed leadframe at which sawing occurs by methods such as coining or others. By taking this measure, a high mechanical stability may be combined with a high-speed sawing.

In an embodiment, the encapsulant has at least one slanted side wall at which the at least one lead extends beyond the encapsulant. In particular, a molded surface may be characterized by a slanted side wall, which may be the fingerprint of the molding process after which the solidified encapsulant is to be removed out of a mold tool. In order to promote such a removal process, slanted side walls in a range from typically 6% to 10% are obtained, in particular 6° to 8°. Thus, the sides of the encapsulant at which the punched lead extends out of the encapsulant may be slanted. In contrast to this, sawn side flanks may be vertical.

In an embodiment, the at least one sawn side flank with the sawn texture has a vertical side wall. Due to the sawing process, during which a sawing blade cuts through package (predominantly encapsulant) material substantially vertically, also the one or more side walls defined by sawing extend vertically.

In an embodiment, the at least one lead is partially or entirely covered with a plating layer. For instance, exposed portions of the lead(s) may be covered by a plating layer, such as a tin layer. More generally, such a plating layer may be made of a solderable material to thereby simplify a solder connection of the package to a mounting base (such as a printed circuit board, PCB) after completing formation of the packages. For instance, an entire exposed surface of the leads may be coated with the plating layer. Alternatively, only a portion of the exposed surface of the at least one lead is coated with such a plating layer. The material of the lead covered by the plating layer may for example be copper.

In an embodiment, the encapsulant has at least one recess in at least one of the at least one side flank having the sawn texture. In other words, a portion (in particular a central portion) of at least one of the side flanks may be delimited by a recess which is not formed by sawing, but for example by punching. Thus, only a part of the side flank may be sawn, whereas another part may be punched. By punching such recesses of the encapsulant, it is for instance possible to remove metallic tie bars holding carriers in a leadframe together before sawing. As a result, sawing may be further accelerated, since sawing through metallic material may be fully prevented due to the removal of tie bar residues. The punched recesses may thus be formed advantageously before sawing.

In an embodiment, the carrier is exposed with respect to the encapsulant at a bottom side of the package. Hence, electrically conductive surfaces may be provided at a bottom side of the package which may simplify electrically connecting the package and which may also promote heat dissipation during operation of the package (in particular when the electronic component is a power semiconductor chip).

In an embodiment, the package comprises a clip electrically connected to an upper main surface of the electronic component. Such a clip may be a curved electrically conductive body accomplishing an electric connection with a high connection area to an upper main surface of a respective electronic component. By embedding a clip in the package for electrically connecting the encapsulated electronic component, any desired electrically conductive path may be established with low effort. Additionally or alternatively to such a clip, it is also possible to implement one or more other electrically conductive interconnect bodies in the package, for instance a bond wire and/or a bond ribbon.

In an embodiment, the clip is integrally formed with the at least one lead. Hence, at least part of the leads may form part of the clip. Thus, a clip may comprise at least one lead as well. Consequently, a connection between the clip and said at least one lead may be solder-free. In particular, a direct physical connection of clip and leads may be possible. Advantageously, the clip itself may thus comprise the above-mentioned or at least one further lead which is partially covered by the encapsulant and which is partially exposed with respect to the encapsulant. Thus, an integrally formed clip-lead-body may significantly simplify manufacture of the package, since an additional connection between clip and lead (for instance by soldering or the like) may be dispensable. This further simplifies the manufacturing process.

In an embodiment, the clip electrically connects the upper main surface of the electronic component with the at least one lead forming part of the carrier. Thus, at least part of the leads may form part of the carrier or may at least belong to a portion of a leadframe which has been initially been connected with the carrier. It is also possible that a part of the leads is provided by the carrier and another part of the leads is provided by the clip.

In an embodiment, a portion of the clip is arranged at the same vertical level as the carrier. For instance, the clip may be a bent body having an upper planar portion connected to an upper main surface of the electronic component and having a lower plate-like portion being arranged coplanar with the carriers or leadframe. Consequently, a highly compact configuration of the package may be obtained.

In an embodiment, the punched surface is an exposed surface of the one lead or lead portion not covered by the encapsulant. In particular, the exposed surface may be one of a punched end surface (see for instance FIG. 4 and FIG. 5) and a punched side surface (see for instance FIG. 37) of the at least one lead. In particular, the at least one lead may be locally thickened at the punched side surface (see for instance FIG. 37 as well). Thus, punching a portion of a leadframe for the formation or definition of the one or more leads may be carried out at the free end of the respective lead, i.e. defining its length. Additionally or alternatively, the punching process may however also form a punched surface of the at least one lead laterally, for instance for disconnecting different leads by removing a corresponding portion of a tie bar or the like. In the latter scenario, due to tolerances or the like, it may happen that the respective lead has a locally thickened portion where it is punched.

In an embodiment, the method comprises mounting further electronic components on further (preferably electrically conductive) carriers, so that the electronic components and the carriers are arranged in a plurality of rows and columns, encapsulating at least part of the further carriers and the further electronic components by further encapsulant, punching further leads extending beyond the further encapsulant, and sawing further side flanks of the further encapsulant. In other words, the manufacturing method may be carried out on leadframe or panel level, i.e. for multiple carriers and for multiple electronic components simultaneously. Such a batch process further reduces the manufacturing effort and allows manufacturing packages on an industrial scale. The carriers and consequently the packages may be arranged in a matrix-like way in rows and columns. Descriptively speaking, sawing may be carried out horizontally, i.e. along the rows, whereas punching may be carried out vertically, i.e. along the columns. In this way, a highly efficient manufacturing process may be obtained.

In an embodiment, the method comprises forming a plurality of parallel bars of material of the encapsulant and the further encapsulant, wherein each bar at least partially encapsulates all carriers and all electronic components of a respective column. According to such a preferred embodiment, bars of encapsulant material may be formed covering for instance all carriers and electronic components of a column of the matrix-like arrangement of preforms of packages simultaneously. As a result, a barcode-like arrangement of parallel vertically extending encapsulant bars may be obtained. This may be carried out highly advantageously by molding. Further advantageously, such a batch-type molding process may render runner structures on the leadframe dispensable, which further simplifies the manufacturing process. Furthermore, gate structures for defining encapsulation paths may be significantly simplified or may be even omitted completely. In particular, the combination of the formation of vertically extending encapsulant bars with the horizontal extension of the leads is of utmost advantage. In one embodiment, such bars of encapsulant materials may have a strip-like rectangular shape in a plan view on the processed leadframe. Alternatively, it is however also possible that the bars are provided with a more complex structure, for instance with one or more indentations extending along a side wall of the bars. Furthermore, it may be possible to form a surface structure or texture in the upper main surface of the encapsulant bars, for instance grooves (such as V-shaped grooves) for further simplifying a subsequent sawing process carried out for singularizing the individual packages under formation of sawn side flanks.

In an embodiment, the method comprises sawing each of the bars to thereby separate a plurality of packages. Hence, each encapsulant bar may be cut into a plurality of individual portions, each portion being assigned to a respective package. This cutting may be accomplished by sawing, in particular mechanically sawing. However, also sawing the multiple encapsulant bars may be carried out in a common process in which a saw blade may saw all parallel and spaced encapsulant bars by firstly sawing along a first horizontal saw row, followed by a second horizontal saw row, and so on.

In an embodiment, the method comprises, before sawing, connecting the bars by a transverse or perpendicular auxiliary bar of encapsulant material. In order to further increase the stability of the semi-finished bar encapsulated leadframe, it is possible to temporarily connect the for instance vertically extending spaced encapsulant bars by an auxiliary encapsulant bar connecting all of them during part of the manufacturing process. Such an auxiliary or connection bar may then be separated from the packages during sawing. By providing such an encapsulant bar serving for stabilizing the other parallel aligned encapsulant bars, the provision of tie bars may be reduced or even fully eliminated, which further simplifies the sawing process. This simplification is a consequence of the fact that sawing may then be carried out only through or substantially only through encapsulant material, and only to an extremely small amount or not at all through metallic material of tie bars.

In an embodiment, the method comprises connecting carriers of at least one column with at least one tie bar. It is also optionally possible to subsequently singularize the obtained structure into the plurality of packages by sawing through the at least one tie bar. Additionally or alternatively to the provision of an auxiliary encapsulant bar, tie bars may be provided for connecting carriers of a respective column or even of adjacent columns in a for instance vertical or oblique manner. These tie bars may improve the stability of the leadframe and of the structures obtained during manufacturing packages. Advantageously, the cross-section of the tiny tie bars may be kept very small so that the sawing process encapsulant material with only a very small content of metallic material.

In an embodiment, the method comprises sawing through the at least one tie bar while sawing the encapsulant bars into the plurality of packages. Thus, the separation of the tie bar and the singularization of the packages may be carried out simultaneously.

In an embodiment, the method comprises connecting a clipframe, comprising a plurality of clips, between two adjacent columns. A clipframe, for instance an integral structure including multiple clips extending in rows and/or columns, may be attached to each electronic component of a respective carrier. The clips of a clipframe may be connected to the interconnected when the clipframe is leadframe. As mentioned above, a clip may be a curved electrically conductive body accomplishing an electric connection with a high connection area to an upper main surface of a respective electronic component mounted on a carrier. Upon singularizing the obtained structure to form individual packages, also the clipframe may be separated into individual clips. Highly advantageously, such a clipframe may be connected to the above-described leadframe already very early during the manufacturing process, for instance after having mounted the electronic components on the carriers of the leadframe. Hence, also the formation of clips may be formed on panel level or in other words for multiple preforms of packages (ideally) simultaneously. In one embodiment, such a clipframe may establish a connection between an upper main surface of an electronic component and the respective carrier. Even more advantageously, the clipframe itself may comprise (for instance initially still integrally connected) leads of the package, which makes a separate solder connection between leads of a carrier and the clip dispensable.

In an embodiment, the method in particular comprises connecting a clipframe to the carriers by plugging, wherein the clipframe comprises a plurality of clips between two adjacent columns, and separating the clipframe into the clips by sawing and/or punching. In particular, it may be possible to separate the clipframe into the clips by punching a tie bar connecting adjacent clips.

In an embodiment, the method comprises connecting the clipframe to the leadframe by plugging, in particular without soldering. In particular, a simple mechanical form closure may be established between clipframe and leadframe. For instance, the clipframe may be clicked or plugged into the leadframe. This may be accomplished for instance by connection pins of the clipframe functionally cooperating with connection recesses of the leadframe, or vice versa. By taking this measure, a connection of multiple clips for multiple packages may be established simultaneously with high efficiency.

In an embodiment, the method comprises connecting each clip of the clipframe between a respective one of the carriers and a respective one of the electronic components. Thus, a clip may establish an electrically conductive connection between the electronic component and in particular a lead of a respective package. Alternatively, it is however also possible that a clip also includes one or more leads which renders the before described connection dispensable.

In an embodiment, the method comprises separating the clipframe into the clips by the sawing and/or the punching.

For example, the clipframe may have a tie bar or support structure interconnecting the individual clips when mounting the clipframe on the leadframe being already provided with the electronic components. This simplifies the provision of clips. When singularizing the integral body of leadframe, clipframe, electronic components and encapsulant into individual packages, the clipframe may be separated into the individual clips by the sawing and the punching process. By sawing, a clipframe may be separated into multiple vertically separated clips or groups of clips. By punching, a vertical separation of a clipframe may be carried out which may be advantageous when the clipframe is provided with a vertically aligned tie bar or support structure which is to be removed for separating two clips arranged in a butterfly fashion on both opposing sides of such a tie bar or support structure.

Hence, a separation of a clipframe into clips may be accomplished in a horizontal direction by sawing and/or in a vertical direction by punching. For instance, a plurality of clips may be arranged being aligned along the columns of the leadframe. It is however additionally or alternatively also possible that the clipframe has for instance two separate clips aligned along each row of the leadframe, i.e. along a horizontal direction. The latter may be described as a butterfly configuration. The above-mentioned tie bar or tie bars may connect said clips of an integral clipframe vertically and/or horizontally. By disconnecting the tie bars by punching simultaneously and in a common process with the separation of the processed leadframe into packages may thus allow to manufacture the packages at high process efficiency.

In an embodiment, the method comprises plating at least part of the at least one lead, in particular before the punching. By such a plating process, an exposed surface of the leads may be made solderable, for instance by a tin coating. By plating before punching, punched ends of the leads may remain free of the plated material. It is however alternatively also possible to plate such free ends after punching, in particular together with the remaining exposed surface of the at least one lead.

In an embodiment, the method comprises carrying out the punching before the sawing. Thus, the above-mentioned encapsulant bars may still remain intact and provide their stabilization after punching. At the very end, they may be sawn by a mechanical saw blade into the individual packages.

In an embodiment, the method comprises carrying out the punching along a punching direction and the sawing along a sawing direction being perpendicular to the punching direction. In an embodiment, the method comprises carrying out the sawing along a sawing direction perpendicular to an extension direction of each of the columns. Highly advantageously, sawing may be carried out along a sawing trajectory which corresponds to the extension direction of the rows. Thus, a fast sawing process may be carried out as a whole and in one along the longer extension direction of the leadframe, and hence highly efficiently. Punching may be carried out along the shorter side of the leadframe. It has turned out that forming encapsulant bars along the longer side of the leadframe may be difficult, while sawing along this direction may be less challenging.

In an embodiment, the method comprises carrying out the punching along a punching direction parallel to an extension direction of each of the columns. In other words, punching may be carried out along the shorter extension direction of the leadframe, i.e. in a vertical direction or perpendicular to index strips.

In an embodiment, shorter sides of the carriers extend along a direction of the columns. By taking this measure, encapsulant bar formation may be accomplished advantageously along the shorter sides and sawing may be carried out along the longer sides.

In an embodiment, the method comprises testing the packages before the sawing, and in particular after the punching. Carrying out a test, for instance an electronic function test, of the packages before completing singularization of the packages, i.e. still on leadframe or panel level, significantly simplifies the testing process. During such a testing process, electrically conductive pins of a test device may be connected to exposed pads or leads of the packages, test signals may be applied, and response signals may be detected. This can be carried out in highly parallel fashion on panel level, i.e. before having separated the processed leadframe into individual packages.

In an embodiment, the method comprises punching a plurality of leads by removing a continuous strip of material connecting the carriers. For instance, such a continuous strip of material may be a tie bar which may be removed as a whole. This may be advantageous when such tie bars are arranged at ends of the leads to be separated.

In an embodiment, the method comprises punching a plurality of leads by removing a plurality of non-continuous sections of material connecting the carriers. In such an alternative embodiment, a punching process may be carried out not at ends of the leads, but at a central portion of them or at a portion of the leads directly adjacent to surrounding encapsulant material. In such a scenario, a plurality of separate island-shaped portions of a tie bar or the like may be removed by punching.

In an embodiment, the method comprises arranging the leads in an interdigitate fashion. Arranging the leads in an interdigitated fashion may particularly mean that the leads are provided as interleaving finger structures. Such a configuration may allow for a compact design of the leadframe and may thereby improve resource efficiency of package manufacturing further.

In an embodiment, the method comprises connecting the leads by tie bars extending along the columns, in particular by forming a mesh structure composed of the leads and the tie bars. Such an alternative embodiment is highly advantageous in terms of compactness and effort. Multiple tie bars may form vertical beams and leads may form horizontal beams of the mesh-shaped structure. For singularization, portions of the tie bars of such a mesh structure between lead portions may be selectively removed.

In an embodiment of the leadframe, no leads extend along the columns. In such an embodiment, all leads assigned to the carriers of the leadframe may extend along the rows, in particular at one of or at both opposing row-sided flanks of the carriers.

In an embodiment, the leadframe comprises at least one tie bar extending along the columns and connecting carriers of at least one column. Tie bars on leadframe level are highly advantageous for keeping together the individual carriers of the leadframe before separation thereof. In particular before encapsulation, said individual carriers may be difficult to handle in the absence of connecting structures such as tie bars. Moreover, such vertically extending tie bars may be easily removable by punching during singularization of the readily manufactured packages from a processed leadframe.

In an embodiment, the leadframe comprises two index strips extending (in particular in parallel) along the rows and being spaced along the columns by the carriers. Such an index strip may be a metallic strip comprising multiple through-holes and may serve for simplifying the automatic handling of the leadframe. Furthermore, the index strips may contribute to a precise alignment of the constituents of the leadframe during package manufacturing. Furthermore, the index strips with holes may contribute to a transport of a leadframe portion to a processing side.

In an embodiment, the leads extend in parallel to index strips of the leadframe. This may include leadframe designs where the individual devices are elongated perpendicular to the index strips or lines, but extend their (at least one) lead in parallel to them.

In an embodiment, the leadframe comprises at least one clipframe, comprising of a plurality of clips for the carriers and extending along the columns between two adjacent columns. Such a clipframe which has been described above may be handled as a whole and may be easily connected, for instance by a plugging or clicking operation, with the leadframe. Connection between leadframe and clipframe may occur after having mounted electronic components on the carriers of the leadframe. The clips of the clipframe may then electrically connect said electronic components. Clipframes may establish a connection between said electronic components and leads of a carrier or may contain leads by themselves, thereby simplifying the electric connection of the electronic component. Clipframes may comprise a horizontal and/or vertical arrangement of multiple clips. Clipframe and leadframe may have cooperating connection structures for establishing a connection between a clipframe and a leadframe. Preferably, multiple clipframes are connected to a leadframe having a matrix-like array of carriers arranged in rows and columns. For instance, two columns of the leadframe may be served per individual clipframe.

In an embodiment, the at least one clipframe comprises a central tie bar extending along the columns and comprises clips on both opposing sides of the central tie bar. Such a central tie bar or support structure of a clipframe may connect clips of a clipframe in a vertical and horizontal direction. Separation of the individual clips of the clipframe into individual clips, each assigned to a respective package, may be accomplished preferably by punching in a vertical direction, i.e. along the column direction. It is however also possible that portions of the clipframe are disconnected by sawing during singularization of the packages in a horizontal direction. Within a leadframe, shorter sides of the carriers may extend along the columns. Correspondingly, longer sides of the carriers may extend around the rows.

In another embodiment, the carriers (rather than being embodied as metallic plate sections of a leadframe, as described above) comprise a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, each of the carriers may also be embodied as a Direct Copper Bonding (DCB) substrate or a Direct Aluminium Bonding (DAB) substrate.

In an embodiment, the package is adapted for double-sided cooling. For example, a first interface structure may thermally couple the encapsulated chip and carrier with a first heat dissipation body, whereas a second interface structure may thermally couple the encapsulated chip and carrier with a second heat dissipation body.

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide or gallium nitride). A semiconductor power chip may comprise one or more field effect transistors, diodes, inverter circuits, half-bridges, full-bridges, drivers, logic circuits, further devices, etc.

As substrate or wafer forming the basis of the electronic components, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in gallium nitride or silicon carbide technology.

For the encapsulating, a plastic-like material or a ceramic material which may be subsidized by encapsulant additives such as filler particles, additional resins or others may be used.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

The illustration in the drawing is schematically and not to scale. In the drawings:

FIG. 24 illustrates a three-dimensional view of a clipframe used for manufacturing packages according to an exemplary embodiment.

FIG. 25 illustrates a cross-sectional view of a clipframe for packages according to an exemplary embodiment.

FIG. 26 illustrates a plan view of a structure obtained during carrying out a method of manufacturing packages according to an exemplary embodiment.

FIG. 27 illustrates a cross-sectional view of a part of a package according to an exemplary embodiment.

DETAILED DESCRIPTION

Figure 1A:
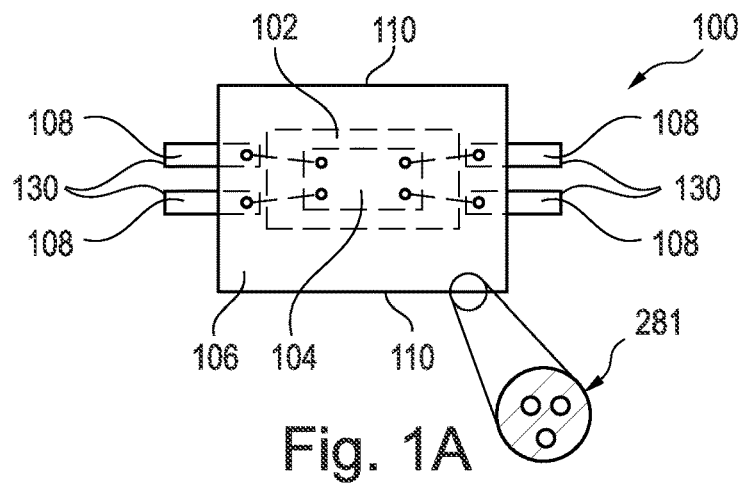
FIG. 1A illustrates a plan view of a package according to an exemplary embodiment.

In the following, further exemplary embodiments of the package, the leadframe concept and the method will be explained.

In the context of the present application, the term "package" may particularly denote an electronic device which may comprise one or more electronic components mounted on a carrier, said carrier to comprise or consist out of a single part, multiple parts joined via encapsulation or other package components, or a subassembly of carriers. Said constituents of the package may be encapsulated at least partially by an encapsulant. Optionally, one or more electrically conductive interconnect bodies (such as bond wires and/or clips) may be implemented in a package, for instance for electrically coupling the electronic component with the carrier.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), a light emitting, semiconductor-based device (such as a light emitting diode (LED) or LASER), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed in silicon technology, gallium nitride technology, silicon carbide technology, etc.

In the context of the present application, the term "encapsulant" may particularly denote a substantially electrically insulating material surrounding at least part of an electronic component and at least part of a carrier to provide mechanical protection, electrical insulation, and optionally a contribution to heat removal during operation. In particular, said encapsulant may be a mold compound. A mold compound may comprise a matrix of flowable and hardenable material and filler particles embedded therein. For instance, filler particles may be used to adjust the properties of the mold component, in particular to enhance thermal conductivity.

In the context of the present application, the term "carrier" may particularly denote a support structure (which may be at least partially electrically conductive) which serves as a mechanical support for the one or more electronic components to be mounted thereon, may also contribute to the electric interconnection between the electronic component (s) and the periphery of the package. In other words, the carrier may fulfil a mechanical support function and an electric connection function. A carrier may comprise or consist of a single part, multiple parts joined via encapsulation or other package components, or a subassembly of carriers. When the carrier forms part of a leadframe, it may be or may comprise a die pad.

In the context of the present application, the term "lead" may in particular denote an electrically conductive (for instance strip shaped) element (which may be planar or bent) which may be assigned functionally to the carrier and which serves for contacting the electronic component from an exterior of the package. For instance, a lead may be partially encapsulated and partially exposed with respect to an encapsulant. When the carrier forms part of a leadframe, leads may surround a die pad of the carrier. The one or more leads may or may not form part of the carrier.

In the context of the present application, the term "leadframe" particularly denote a metal structure comprising an array of initially integrally connected carriers and leads for packages. The electronic components may be attached to the carriers of the leadframe, and then bond wires and/or clips may be provided for attaching pads of the electronic component to leads of the leadframe. Subsequently, the leadframe may be molded in a plastic case or any other encapsulant. Outside and/or inside of the leadframe, corresponding portions of the leadframe may be cut-off, thereby separating the respective leads and/or carriers. Before such a cut-off, other procedures such a plating, final testing, packing, etc. may be carried out. A leadframe may be composed of multiple carriers for electronic components, wherein each carrier may have a mounting section and one or more leads.

In the context of the present application, the term "punched surface" may particularly denote a surface area delimiting the one or more leads and being defined by punching. Punching may denote a forming process that uses a punch press to force a tool, which may be denoted as a punch, through the workpiece to create a hole via shearing. Punching is applicable to a wide variety of materials in sheet form, including sheet metal. Punching is a simple and therefore highly efficient method of defining structures in a patterned sheet material. Correspondingly, a punched surface is a surface defined by punching. A person skilled in the art will understand that a punched surface has dedicated properties which can be easily and unambiguously analysed by a person skilled in the art. At the punched surface delimiting the lead, a corresponding side flank of the encapsulant may be defined by the encapsulation process, in particular by molding. A corresponding encapsulant, such as a mold compound, may comprise a matrix (for instance comprising a resin) with filler particles. At a molded surface corresponding to a punched surface of the leads, the filler particles are coated by matrix material of the in particular mold compound-type encapsulant so as to form a defined structure with coated pixels on the surface. Moreover, a molded side flank at a punched surface of a corresponding lead may be slanted (for instance with a slanting angle in a range between 6° and 12°, in particular between 8° and 10°) for promoting removal of a corresponding mold body out of a mold tool.

In the context of the present application, the term "sawn texture of side flanks" may particularly denote a surface structure or surface profile on a side surface of an encapsulant being defined by sawing. Preferably, said sawing process is a mechanical sawing process using a saw blade. Alternatively, also laser sawing is possible. Due to such a sawing process, in particular mechanical sawing process using a saw blade, a rough surface texture (in particular having a roughness Ra of more than 0.8 μm, in particular between 0.8 μm and 5 μm, for instance around 1 μm) is obtained. Such a saw rough characteristic of a sawn side flank is combined with the formation of microscopic scratches, marks, rills or corrugations formed by the sawing tool. For instance, a mechanical saw blade may have polyimide bound diamond bodies used for sawing which may for example create the mentioned sawn texture. In particular, a sawn texture of the at least one side flank may comprise a roughness Ra of more than 0.8 μm in combination with corrugations having larger dimensions compared to dimensions of protrusions and indentations relating to a said roughness. The roughness of a surface may be defined as and may be measured as the centerline average height Ra. Ra is the arithmetic mean value of all distances of the profile from the centerline. For instance, the measurement or determination of roughness Ra of the sawn surface, as mentioned in the context of the present application, may be carried out according to DIN EN ISO 4287:2010. A saw used for forming the sawn texture may be denoted as a tool comprising a tough saw blade with a hard-toothed edge. Such a saw may be used to cut through encapsulant material and optionally also through metallic material of the one or more leads by placing the tooth edge against the material and moving it forcefully forth and less forcefully back or continuously forward. For instance, a powered circular saw blade may be used for this purpose. At a sawn side flank of an encapsulant, in particular a sawn side flank of a mold compound, a broken surface may be obtained at which also filler particles are sawn at the surface of the sawn side flank. As a consequence, a sawn side flank may be defined by material of the above-described matrix of the encapsulant and partially also by cut non-coated filler particles.

In an embodiment, at least one other side flank of the encapsulant has a molded texture. In particular, two opposing side flanks of the encapsulant may be at least partially sawn and two other side flanks of the encapsulant may have a molded texture. In the context of the present application, the term "molded texture" may particularly denote a characteristic surface profile of a side flank formed by molding. In particular, such a molded texture may comprise a smooth surface (in particular having a lower surface roughness Ra than a side flank with a sawn texture) with microscopic surface pixels corresponding to filler particles added to a mold compound, appearing at an exterior surface of a mold-type encapsulant and being coated with molded encapsulant material (in particular mold resin). Thus, two side flanks of the package outline may be defined by sawing, whereas the other two side flanks may be defined by molding. Such a package feature is the fingerprint of the highly advantageous manufacturing process flow described below for instance referring to FIG. 3.

In an embodiment, the at least one lead is arranged at a shorter side of the (for instance substantially rectangular) carrier, in particular at two opposing shorter sides of the carrier. By arranging the one or more leads at the shorter sides of the carrier group-wise encapsulation of packages in columns may be combined with punching along columns and sawing along rows. This architecture is a paradigm shift over conventional approaches.

Before exemplary embodiments will be described in more detail referring to the figures, some general considerations will be summarized based on which exemplary embodiments have been developed.

According to an exemplary embodiment, a package is provided which has an exterior outline defined or delimited by sawing (in particular by mechanically sawing) at least predominantly through encapsulant material, by punching (in particular of one or more leads) and by encapsulating (in particular by molding). Such a package having punched leads and sawn side flanks as well as preferably molded other side flanks assigned to the leads may be manufactured advantageously by a leadframe provided by another exemplary embodiment. Such a leadframe comprises a matrix-like arrangement of carriers with leads extending along the longer direction of the substantially rectangular leadframe. Formation of horizontally aligned leads enables encapsulation (in particular molding) in a transverse or vertical direction under formation of stabilizing encapsulant bars (such as mold bars), which may be formed parallel to each other and spaced with respect to each other. Typical dimensions of the shorter side of such a leadframe (for instance in a range between 50 mm and 150 mm, in particular 60 mm to 120 mm) are perfectly compatible with mold technology. Moreover, sawing for singularization of packages is possible in a very fast way along the longer direction of the leadframe. Hence, a plurality of parallel and horizontal saw paths may be used for singularization of the packages and for separating each encapsulant bar into portions corresponding to the various packages. Advantageously, such a manufacturing process flow does not result in a significant loss of mold material so that resources can be used efficiently. Furthermore, conventionally required mold structures (in particular runners and to a certain degree also gate structures) may be omitted in a leadframe in collaboration with a mold tool when carrying out the described formation of encapsulant bars. Such a manufacturing process is very fast, in particular when the described mechanical sawing process using a mechanical saw blade can be carried out by sawing horizontally only (or substantially only) through encapsulant material, and not (or only to a very limited degree, for instance through tiny metallic tie bars) metallic material. Furthermore, such a manufacturing process flow also enables testing of the readily manufactured packages still on panel level, i.e. when still forming an integral structure with the leadframe.

Preferably, the leadframe may be equipped with a clipframe comprising multiple clips arranged along both a horizontal and vertical direction. Preferably, the clips of the clipframe may be arranged in such a way that a 180° twisting or rotation of the clipframe does not result in a misalignment.

Embodiments are also compatible with dual gate package requirements, i.e. packages having different portions with different leadframe thicknesses.

According to an exemplary embodiment, a multi process block concept for reducing manufacturing effort for (in particular dual side) package platforms is provided. By such embodiments, it may become possible to obtain full LTI (lead tip inspection) functionality at ultra-high leadframe density, provide a very simple mold layout, achieve highly efficient EMC (epoxy molding compound) usage, and enable panel level testing. Advantageously, these features may be obtainable using existing equipment and may maintain the current device footprint.

Descriptively speaking, a gist of an exemplary embodiment is to rotate carriers of a leadframe by 90° as compared to conventional approaches. In particular, it may be possible to hold structures in horizontal direction by the use of tie bars which may be connected with a vertical lead bar. Moreover, it may become possible to use cavity molding without runners and gates, only to define leaded sides. Mold bars (or more generally encapsulant bars) may be formed along a short side of the leadframe for easy filling. Descriptively speaking, it may thus be possible to form a barcode-shaped mold pattern for encapsulating electronic components and carriers along a complete column of the leadframe simultaneously. Advantageously, it may be possible to carry out a punching process along a vertical lane or direction. This may enable the formation of LTI feature and simultaneously a removal of vertical lead bars in one common process. Moreover, it may be possible to hold preforms of packages in vertical direction by mold material only. In particular, it may be possible to use such a processed panel for panel-level testing. Moreover, it may be possible to carry out thin dicing (for instance with dicing streets having a thickness of at least 30 µm, preferably 150 µm and most preferably in particular for certain metal content within the dicing corridor 200 µm to 400 µm) and fast dicing (for instance with a sawing speed of up to 1000 mm/s (or even higher effective speeds when multiple spindle designs are deployed), but preferably 300 mm/s to 600 mm/s) in a horizontal lane or direction only. Advantageously, no metal (such as copper) is present within this lane. Furthermore, dicing may result in a very narrow device pitch. As a consequence, a highly parallelized design and processing may be obtained. Sawing may be carried out in a particular fast manner and for instance in one direction only.

Such embodiments may provide a significant improvement of a manufacturing process so that the manufacturing effort and material waste during high-volume production of different types of packages (in particular SON, TOLL and DSO packages) may be reduced. This may be achieved simultaneously while maintaining device footprint and avoiding the need of an additional effort in terms of a more sophisticated manufacturing equipment.

Specifically, exemplary embodiments may provide ultra-high leadframe densities, may bypass conventional bottlenecks of mold processes, may allow for panel scale testing and may combine and efficiently use leadframe area with efficient package singularization. Process flows according to exemplary embodiments may further allow to obtain an LTI feature integration.

Exemplary embodiments may be implemented, for example, for DSO, TOLL and SON packages. Some packages of these and other types (for instance TDSON or HSOF packages) may conventionally sacrifice leadframe density to allow for efficient singularization. Others such as S3O8 packages (for example of the TSDSON-type) may provide proper leadframe densities but may require saw singularization routines which may be conventionally slower than rapid punching routines, for instance due to an excessive amount of copper in corresponding sawing streets.

Exemplary embodiments may reduce the fabrication effort for multiple package types such as SON packages (for instance TDSON, TSDSON), DSO packages (for example DSO) and TOLL packages (such as HSOF). First, the leadframe design may be improved by exemplary embodiments. Second, the mold process may be simplified. Third, the final singularization may be improved.

Concerning the leadframe design, a dead area on the leadframes which is conventionally reserved for runner structures may be reduced by exemplary embodiments by rotating the individual packages within their leadframe superstructure by 90°, and a thereby a reduction of the package pitch distance may become possible. As a consequence, the effort for manufacturing the leadframe may be significantly reduced.

Considering the mold process, the formation of encapsulation bars for cavity molding may render conventional runner structures on the leadframe redundant or dispensable. With such an approach, an easier increase of the panel dimension can be reached.

Concerning package singularization, the leadframe design may be tuned by exemplary embodiments to allow punch singulation of leads. Singularization along the longer leadframe axis may be designed to permit fast saw singularization, in particular by omitting completely or largely copper or any other metal in the saw streets. In an embodiment, prior to final saw singulation, device testing on panel scale is an advantageous option. Furthermore, the manufacturing process may be designed to allow for full LTI features.

A gist of an exemplary embodiment is thus constituted by (a) the rotation of the individual package in its leadframe assembly by 90° (in particular in comparison with conventional approaches), (b) the replacement of mold runner structures with a confined space map mold routine along the short half axis of the leadframe effects a significant reduction of dead leadframe area and mold material waste and (c) the combination of punch-based and saw-based singulation along the horizontal, lead terminal, and vertical, leadless package side, respectively. The latter may also allow for the creation of a full LTI feature. The result of a manufacturing process according to an exemplary embodiment is a footprint neutral (in particular dual outline) package with punched lead terminals and two diced sides.

According to a further exemplary embodiment, parallelization of clip mounting processes may be obtained. In particular, the above described manufacturing process flow may be used for an arrangement of device structures including clips. In such an embodiment, the above described characteristics or advantages (in particular in terms of cavity molding, sawn side flanks, punched leads with LTI, etc.) may be combined with a (for instance butterfly-shaped) leadframe- and clipframe design. In particular, it may be possible to mount one or several clipframes per leadframe panel. In such an embodiment, it may be possible that a lead bar of the clipframe is positioned in the same elevation level as a lead bar of the leadframe. In particular, it may be possible to provide no protrusion from this surface, thereby allowing simple and conventional mold tool designs. After assembly of the one or more clipframes, it may be possible to punch lead bars of both leadframe and clipframe. In particular, it may be possible that said clipframe has a gate contact terminal incorporated separation from a source terminal by punching of one or more lead bars. Thus, an exemplary embodiment may implement an embedded clipframe architecture for reducing the manufacturing effort in (in particular dual side) package platforms.

In particular, it may be possible to deploy an embedded clip design that (a) bypasses manufacturing effort that may arise in conventional leadframe design and (b) may significantly reduce effort of conventional clip attach processes. Thus, a universal process design for high throughput manufacture of (in particular dual side) package platforms may be provided that may generate a significant reduction of effort during package manufacturing. Also with the described clip frame design, essentially no additional manufacturing equipment is needed, and the final package footprint may be maintained.

According to an exemplary embodiment, a clipframe may be added to a leadframe designed to miss one lead side of the dual side its package in initial leadframe superstructure. Additionally, one package column may be connected with its identical, but mirrored column via a lead bar structure that holds both package columns in the leadframe in a butterfly-shaped arrangement.

In embodiments, after die attach (i.e. mounting electronic components on carriers of the leadframe), an embedded clipframe may be attached to the leadframe. Such an embedded clipframe may be designed in a similar butterfly shaped superstructure and may be deposited or placed into the leadframe. Such a clipframe may be punched from a continuous clip reel and deployed in a multi-part pick and place process where all individual clipframes necessary to load one leadframe may be attached to the leadframe at the same time. Furthermore, the individual clip frames may be bent such that the final lead bars of clipframe and of the leadframe are on the same level. Clipframe (s) and leadframe may be connected through an electrically conductive (for instance solder bed mediated) plug-in connection to allow for an efficient electroplating.

Thus, a clipframe may be transferred into a leadframe. Both clipframe and leadframe lead bar may be arranged on the same height level. Clipframe and leadframe may be connected through an electrically conductive plug-in connection. All following manufacturing processes may be similar to the previously described multi process block concept for (in particular dual side) package platforms.

A clipframe design according to an exemplary embodiment may allow the deposition of electrically conductive solderable spots (for instance silver spots) on the gate lead via continuous plating. When the gate lead is designed d as part of the clipframe, its plating can be conducted before the clipframe is punched from its original source reel.

Thus, an exemplary embodiment relates to a package which has punched leads, sawn side flanks and no heterogeneous medium mediated link between clip and leads. In other words, such embodiments may provide one or more leads forming part of a clip rather than being separately connected with a clip. Advantageously, such a clipframe may be provided with a rotated butterfly design within a leadframe pattern, which may allow obtaining a high clipframe density. In particular, a missing solder link between clip and lead may characterize such a clip architecture in which a clip itself may have one or more integrally formed leads.

Instead of butterfly-type clipframe (s) and leadframe, both frames can be stuck on top of each other to yield multi-level leadframe structures to be punched through.

According to yet another exemplary embodiment, an inlay frame may be provided for reducing manufacturing effort in (in particular TO-type) package platforms. In such embodiments, it may be possible to allow an adoption of effort reducing process blocks for the fabrication of packages, in particular dual gage packages. Specifically, a modified leadframe handling concept may be introduced into the manufacturing process that may allow to obtain a low-effort mold process (in particular by the formation of encapsulant bars formed by molding) and the singulation approach of combined punch- and saw singulation.

Dual gage packages like packages of the TO 247-type may for instance be manufactured by exemplary embodiments as follows:

Concerning the leadframe, standard leadframes may form the basis for a further manufacturing process. Before molding, a leadlength cut via punching may be performed to thereby customize the leadframe.

For the subsequent molding process, multi-package ensembles may be placed in the mold chamber to yield interdigitated leads. Bar molding, as described above, may then be performed, and a horizontal auxiliary mold bar connecting the multi-package ensembles may be integrated. For lead plating, appropriately shaped (for instance crocodile-shaped) clips may be connected to the leadframe on the opposite side of the mold bar thereby enabling electrochemical plating.

At the end of the manufacturing process, separation or singulation process may be carried out, for instance as described above. Specifically, punch singulation may be conducted along a leadframe short side. Singulation along the long leadframe axis may be designed so as to permit fast saw singulation (in particular without a metal, such as copper, in the saw streets). A readily manufactured package according to such an embodiment may have a slightly changed outline or footprint and may yield an asymmetric package (see for example FIG. 37).

The described manufacturing process according to exemplary embodiments may keep the manufacturing effort small while enabling to obtain a highly matured, leaded TO package by increasing leadframe density, reduction of mold waste and a highly advantageous singulation approach. Specifically, an interdigitated side-by-side arrangement of fragmented standard dual gage leadframe strips together with highly material saving strip molding and saw singulation may be used in an advantageous process combination, thereby yielding a device with only slightly modified footprint.

An obtained package according n exemplary embodiment may have punched leads, sawn side flanks and an asymmetric final package footprint. A reassembled leadframe may be connected via a horizontal auxiliary mold bar. The described manufacturing process may be particularly advantageous for dual gage packages.

FIG. 1A illustrates a plan view of a package 100 according to an exemplary embodiment.

The illustrated package 100 comprises a carrier 102. An electronic component 104 is mounted on the carrier 102. An encapsulant 106 encapsulates the carrier 102 and the electronic component 104. Leads 108 extend beyond the encapsulant 106 and have a punched surface 130, i.e. a surface formed by punching. Opposing side flanks 110 of the encapsulant 106 have a sawn texture 281, i.e. a surface texture formed by sawing (as described in further detail referring to FIG. 5).

Figure 1B:
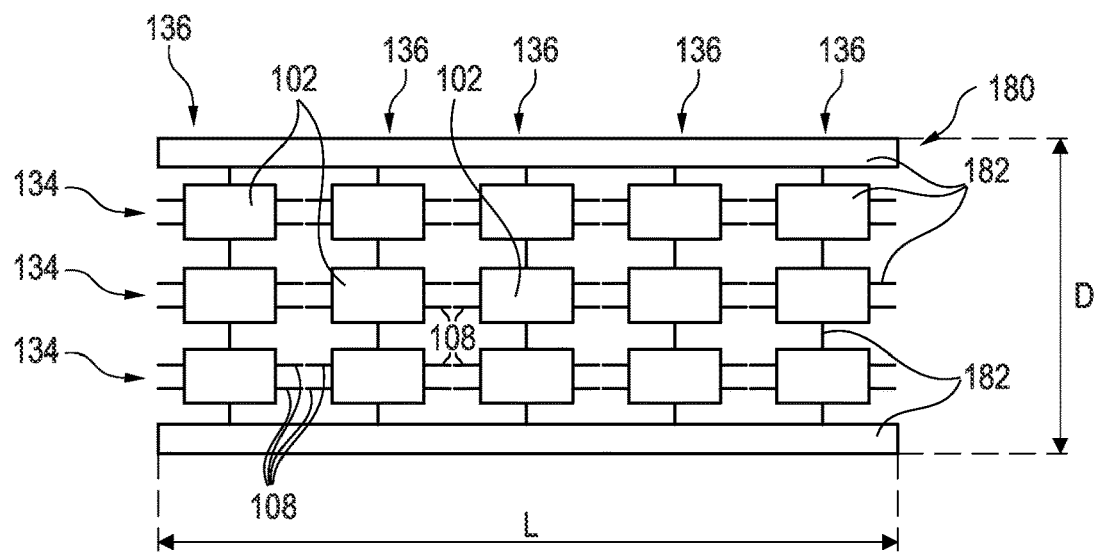
FIG. 1B illustrates a plan view of a leadframe according to an exemplary embodiment.

FIG. 1B illustrates a leadframe 180 according to an exemplary embodiment. The shown leadframe 180 comprises a patterned electrically conductive sheet 182. A plurality of carriers 102 are defined d within the sheet 182 and are arranged in rows 134 (extending along a horizontal direction of FIG. 1B) and columns 136 (extending along a vertical direction of FIG. 1B). Leads 108 are assigned to each of the carriers 102. The sheet 180 has a larger extension L along the rows 134 as compared to a smaller extension D along the columns 136. The leads 108 extend along the rows 134 rather than along the columns 136.

Figure 2:
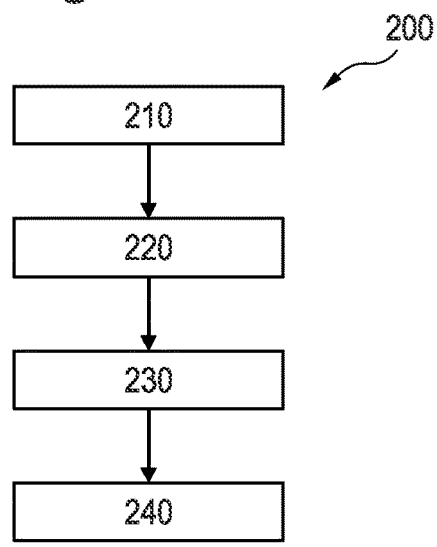
FIG. 2 illustrates a block diagram of a method of manufacturing a package according to an exemplary embodiment.

FIG. 2 illustrates a block diagram of a method of manufacturing a package 100, as the one shown in FIG. 1A, according to an exemplary embodiment. The reference signs mentioned in the following description referring to FIG. 2 correspond to the embodiment of the package 100 according to FIG. 1A.

As indicated by a block 210, an electronic component 104 may be mounted on a carrier 102. Referring to a block 220, at least part of the carrier 102 and at least part of the electronic component 104 may be encapsulated by an encapsulant 106. Referring to a block 230, at least one lead 108 extending beyond the encapsulant 106 may be punched. Moreover, at least part of at least one side flank 110 of the encapsulant 106 may be sawn, compare block 240.

Figure 5:
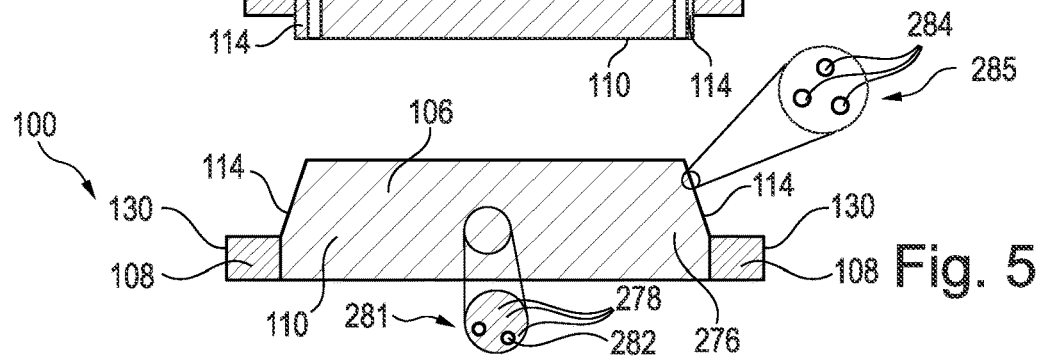

While for instance two opposing side flanks 110 of the encapsulant 106 are partially or entirely sawn and therefore has sawn texture 281, the two other opposing side flanks (from which the leads 108 extend) of the encapsulant 106 have a molded texture, i.e. have surface properties of a molded surface (as described in further detail referring to FIG. 5, see reference sign 285).

Figure 3:
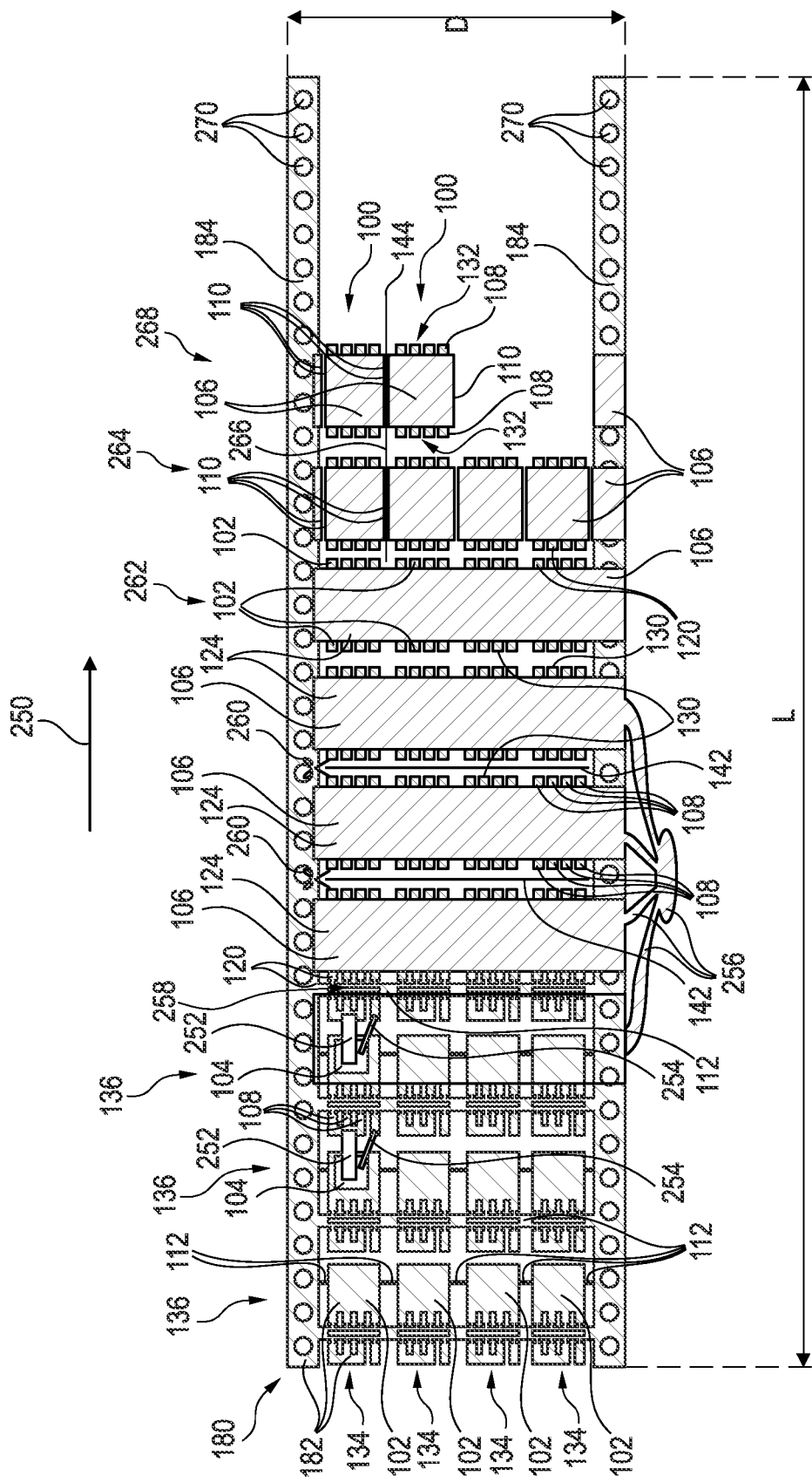
FIG. 3 illustrates a plan view of structures obtained during carrying out a method of manufacturing packages according to an exemplary embodiment.

FIG. 3 illustrates a plan view of structures obtained during carrying out a method of manufacturing packages 100 according to an exemplary embodiment.

The illustrated structures are obtained by processing a leadframe 180 according to an exemplary embodiment. Said leadframe 180 comprises a patterned electrically conductive sheet 182, for instance a punched or etched copper plate. Multiple carriers 102, each configured for carrying a respective electronic component 104, are defined within the sheet 182 in a matrix-like pattern. In other words, the carriers 102 are arranged in rows 134 (extending horizontally according to FIG. 3) and columns 136 (extending vertically according to FIG. 3) of the leadframe 180. As shown, shorter sides 132 of the carriers 102 may extend along a direction of the columns 136. Multiple leads 108, configured for forming exterior connections of a readily manufactured package 100, are assigned to each of the carriers 102 and form part, in the presently described embodiment, of the leadframe 180. More specifically, a respective lead 108 may electrically connect a respective electronic component 104 mounted on a respective carrier 102 with an electronic environment of a readily manufactured package 100. A connection of the leads 108 with the electronic component 104 may be established by an electrically conductive connection element such as a clip 252 and/or a bond wire 254.

As illustrated schematically in FIG. 3, the leadframe 180 has a larger extension L in the horizontal or main direction as compared to a smaller extension D in the vertical or transverse direction. In the embodiment of FIG. 3, length L may be for example in a range from 250 mm to 300 mm (for example approximately 250 mm or approximately 300 mm), whereas width D may be for example in the range from 60 mm to 100 mm (for example approximately 62 mm, approximately 70 mm or approximately 100 mm). All leads 108 extend along the main direction and along two antiparallel directions in the readily manufactured packages 100. Moreover, FIG. 3 shows tiny tie bars 112, which are here integrally formed with the carriers 102, extending along the transverse direction and connecting the carriers 102 of a respective column 136 with each other. Said tie bars 112 may provide stability to the leadframe 180 at early processing stages, in particular before encapsulation. In other words, each column 136 of carriers 102 may be provided with a tie bar 112 connecting all carriers 102 of a respective column 136. With the manufacturing process flow according to FIG. 3, horizontal parallel side flanks 110 of the obtained packages 100 are defined predominantly by material of the encapsulant 106 and to a significantly smaller extent by copper material of the tie bar 112 connected to the respective carrier 102.

As shown as well in FIG. 3, two parallel metallic index strips 184 form an upper end and a lower end of the leadframe 180 and extend along the main direction. The rows 134 of carriers 102 are arranged vertically between an upper index strip 184 and a lower index strip 184. The index strips 184 simplify automated handling and alignment of the leadframe 180 during processing.

As already mentioned, a respective electronic component 104, for instance a semiconductor chip, is mounted on each of the carriers 102. Thereafter, a respective part of each of the carriers 102 and the electronic components 104 mounted thereon may be encapsulated by a mold-type encapsulant 106. As a consequence, parallel aligned and spaced vertically extending encapsulant bars 124 are formed, each made of mold component material and covering the electronic components 104 of a respective column 136. With a common encapsulation process, multiple packages 100 may be encapsulated highly efficiently. Thus, a plurality of parallel encapsulation bars 124 of material of the encapsulant 106 may be formed during the manufacturing process, wherein each bar 124 encapsulates all carriers 102 and all electronic components 104 of a respective column 136.

After surface mounting the electronic components 104 on the carriers 102 and connecting the electronic components 104 with the carriers 102 by clips 252 and bond wires 254 and after encapsulation, the method comprises plating the exposed portions of the leads 108. Plating the leads 108 with a solderable material such as tin enables a lead tip inspection of the manufactured packages 100 and promotes connection of the packages 100 to an electronic environment by soldering.

As a first process during singularization of the individual packages 100 from the processed leadframe 180, said leads 108 of the carriers 102 extending beyond the encapsulant 106 may be cut by punching on both lateral sides of each of the packages 100. Punching the leads 108 may be accomplished by removing a continuous strip of material of the leadframe 180 connecting different carriers 102.

As a second process during singularization of the individual packages 100, two opposing horizontal side flanks 110 of the encapsulant 106 of each respective package 100 may be defined by mechanically sawing using a rotating saw blade (not shown). Hence, each of the bars 124 is separated by sawing into a plurality of sections, each forming part of a respective package 100. As a consequence, readily manufactured encapsulated packages 100 are obtained which have partially exposed leads 108 at two opposing side surfaces, whereas two opposing horizontal side surfaces or side flanks 110 of the encapsulant 106 are free of leads 108 and defined by sawing. In particular, the method comprises sawing through the tie bars 112 of a respective column 136 while sawing each of the encapsulant bars 124 into the plurality of packages 100. By making sure that the large majority of the sawn material is mold material of the bulky encapsulation bars 124 and only to a very small extent copper material of the tiny tie bars 112, a fast and simple sawing process is enabled.

Advantageously, the particular punching may be carried out before the horizontal sawing. More specifically, the punching process may be carried out along a vertical punching direction 142 and the sawing may be executed along a horizontal sawing direction 144, i.e. perpendicular to the punching direction 142. As shown in FIG. 3, the sawing may be performed in sawing direction 144 being oriented perpendicular to an extension direction of each of the columns 136.

Optionally, possible to it is carry out an electronic function test of the packages 100 before the sawing and after the punching. Testing the packages 100 on panel level significantly simplifies the testing procedure.

As shown in FIG. 3, the described manufacturing process flow can be carried out in a batch manner so that the packages 100 can be produced on panel level, i.e. by processing a common leadframe 180 in a highly parallelized way.

The manufacturing process flow as well as the leadframe design according to FIG. 3 provides a space optimized design without the needs of gates and runner areas for encapsulation. Thereby, a high density of simply manufacturable packages 100 may be obtained. Formation of mold bars 124 created by cavity molding is compatible with a no-gate layout. Such a manufacturing concept involves no dead areas, so that a more efficient mold compound usage per device or package 100 becomes possible. Moreover, there is no need of de-gating, which additionally simplifies the manufacturing process. During the manufacturing process, a lead-/dambar punch can be carried out in terms of a single side punching. Thus, no additional lead bar is needed. The described plating process allows to manufacture in a simple way an LTI (lead tip inspection) feature. By two stage punching, no electrical connection between leads 108 remains. Furthermore, marking and testing on panel level is enabled.

Dicing in one direction does not requires stepcut. A very small copper amount, if at all, within a dicing street enables fast dicing, in particular with a speed of 100 mm/s or more. Punching of dambars is properly compatible with the formation of an LTI feature, since it is a parallel process. Since punching needs some space on the leadframe 180, punching is used only in one direction. Dicing is a space saving singulation process but may be slow if excessive amount of metal exists within the dicing street. Thus, an efficient manufacturing process may remove any major metal content from the dicing street, for instance by configuring the dicing street to consist of encapsulant material only, optionally with the only exception of tiny metallic tie bars 112. A certain amount of material in a dicing street may also be removed together with the punching process from above, to further accelerate the sawing process. Referring again to the mold bars 124, the devices or preforms of the packages 100 may be kept in place by material of the mold compound only. Hence, there is no risk of shortages. Testing of the packages 100 in the panel or leadframe 180 is also possible.

Furthermore, the panel or leadframe 180 may be provided without dambars and can be handled for plating, marking and testing. It may be attached to a dicing foil (not shown) or may be placed on a dicing chuck (not shown) for tapeless dicing. The readily manufactured package 100 or device may have a two-sided sawn surface texture (compare reference sign 281 in FIG. 1A and FIG. 5) and two-sided mold-cavity surface texture (compare reference sign 285 in FIG. 5). The package 100 has punched leads 108 and sawn side flanks 110. In one embodiment, the two sawn side flanks 110 may relate to a mold compound surface only with no cut tie bars 112 forming part of said sawn surface. In another embodiment, the sawn surface at the side flanks 110 may be predominantly formed by material of encapsulant 106, whereas a very minor portion may relate to cut tie bars 112.

During the manufacturing process which is carried out according to a workflow corresponding to arrow 250, the process may start with the provision of leadframe 180 of the type described above referring to FIG. 1B which may here be embodied as a punched or etched copper plate. The individual carriers 102 and tie bars 112 between the opposing index strips 184 may be formed as part of said leadframe 180. The manufacturing process may then continue with a die attach during which electronic components 104, for instance semiconductor chips, may be attached to corresponding mounting sections (such as die pads) of the carriers 102. An upper main surface of such an electronic component 104 may be connected to leads 108 by clip 252, bond wires 254, etc. After said clip attach and wire bond formation process, encapsulation by molding can be carried out as indicated schematically by reference numeral 256. Said molding process may be carried out in a simple way without runners (which may be necessary conventionally) and with a limited effort concerning gates so that a plurality of parallel aligned encapsulant bars 124, here embodied as mold compound bars, are formed. After molding and as indicated by reference sign 258, it is then possible to carry out a plating process for plating exposed surface portions of the leads 108. Thereby, the leads 108 may be covered by a plating layer 120. Such a plating process may be carried out to provide a lead tip inspection (LTI) capability. Thereafter and as indicated by reference sign 260, the punching process may be carried out during which vertically aligned tie bars 112 between carriers 102 and integrally connecting leads 108 of adjacent carriers 102 may be separated. At a stage of the manufacturing process denoted with reference sign 262, the still integrally connected packages 100 may be tested on panel or leadframe level and may be marked. As indicated with reference sign 264, the individual packages 100 may be singularized from the previously integral encapsulant bars 124 and connected constituents by sawing along horizontally aligned sawing streets 266. Thereafter, a tape and reel procedure may be carried out, see reference numeral 268, and the individual packages 100 may be de-taped into a bowl. During handling the leadframe 180 in the described manufacturing method, the index strips 184 with through-holes 270 may simplify the transport and the alignment of the leadframe 180 and the described constituents.

In particular, the combination of the design of the leadframe 180, the formation of the encapsulant bars 124 and the combined punching and sawing singularization process are of utmost advantage in order to simplify the manufacturing process and to manufacture the packages 100 at low effort und reduced or even minimized waste conditions.

Figure 4:
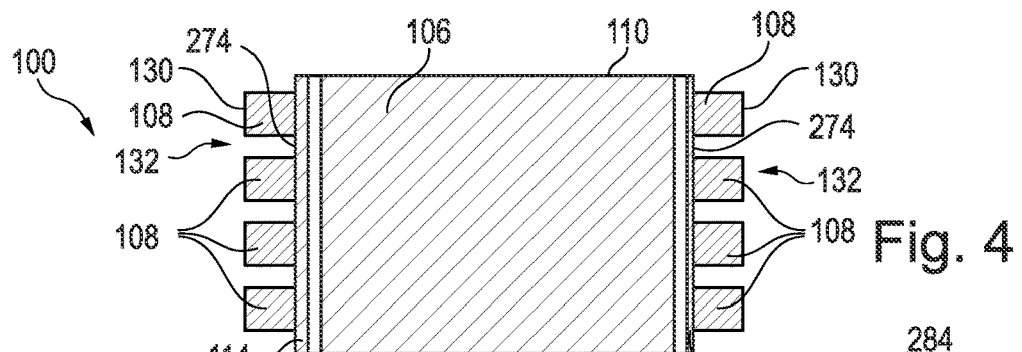
FIG. 4 illustrates a plan view and Figure illustrates a side view of a package according to an exemplary embodiment.

FIG. 4 illustrates a plan view and FIG. 5 illustrates a side view of a package 100 according to an exemplary embodiment.

The package 100 illustrated in FIG. 4 and FIG. 5 comprises an electrically conductive carrier 102 which is here embodied as a copper portion of a leadframe 180, such as the one shown in FIG. 3. Carrier 102 is encapsulated by encapsulant 106 and therefore not visible in FIG. 4 and FIG. 5. Furthermore, an electronic component 104 (for instance a semiconductor die, not shown in FIG. 4 and FIG. 5 as well) is surface mounted on the carrier 102. Moreover, a mold-type encapsulant 106 encapsulates the carrier 102 and the electronic component 104. As shown, an array of parallel aligned leads 108 extends at two opposing side flanks of encapsulant 106 beyond the encapsulant 106.

Each of said leads 108 has a punched end surface 130. The two other remaining side flanks 110 of the encapsulant 106 are completely formed by sawing.

As shown in FIG. 4, the leads 108 are arranged at two opposing shorter sides 132 of the carrier 102. The side flanks 110 are defined by sawing and are delimited exclusively by material of the encapsulant 106, i.e. by mold-compound material having filler particles 284. As can be taken from FIG. 5, the encapsulant 106 has slanted side walls 114 at surfaces defined by molding and at which the leads 108 extend beyond the encapsulant 106. The side flanks 110 defined by sawing have vertical side walls. At a bottom side of the package 100, the carrier 102 may be exposed with respect to the encapsulant 106 (not shown in FIG. 4 and FIG. 5).

The embodiment of FIG. 4 and FIG. 5 shows package 100 with leads 108 extending in parallel out of the encapsulant 106 at both opposing slanted side walls 114 of the package 100. In other words, package 100 is a dual sided package. The free ends of the leads 108 are formed by punched surfaces 130. Surface portions 274 of the encapsulant 106 adjacent to the leads 108 are surfaces defined by the mold process. The side flanks 110 however are defined by sawing, more specifically by mechanically sawing. As shown in FIG. 5, the sawn surface 276 of the package 100 has a high roughness of for example Ra=1 μm and has microscopic corrugations 278, as illustrated in a detail showing a sawn texture 281. Cut filler particles 282 can be seen as well as at this surface. Due to their definition by the molding process, the slanted side walls 114 have a surface appearance as indicated in a detail illustrating a molded texture 285. Filler particles 284 of the mold compound at the slanted side walls 114 defined by the mold process are coated with mold material (in contrast to the filler particles 282 which are cut) and form a dot or pixel structure on the exterior surface of the slanted side walls 114.

Figure 6:
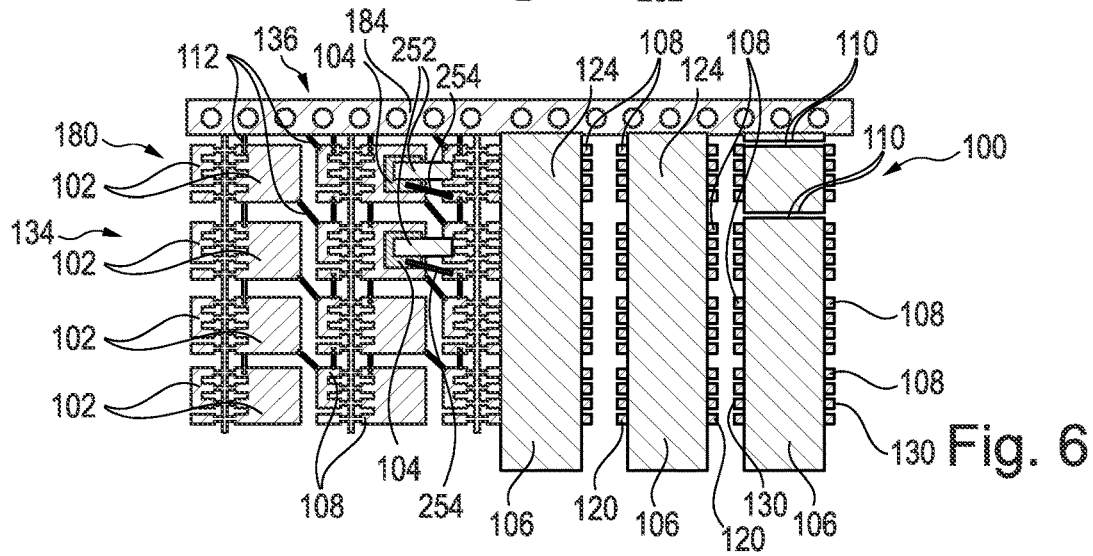
FIG. 6 illustrates a plan view of structures obtained during carrying out a method of manufacturing packages according to an exemplary embodiment.
Figure 7:
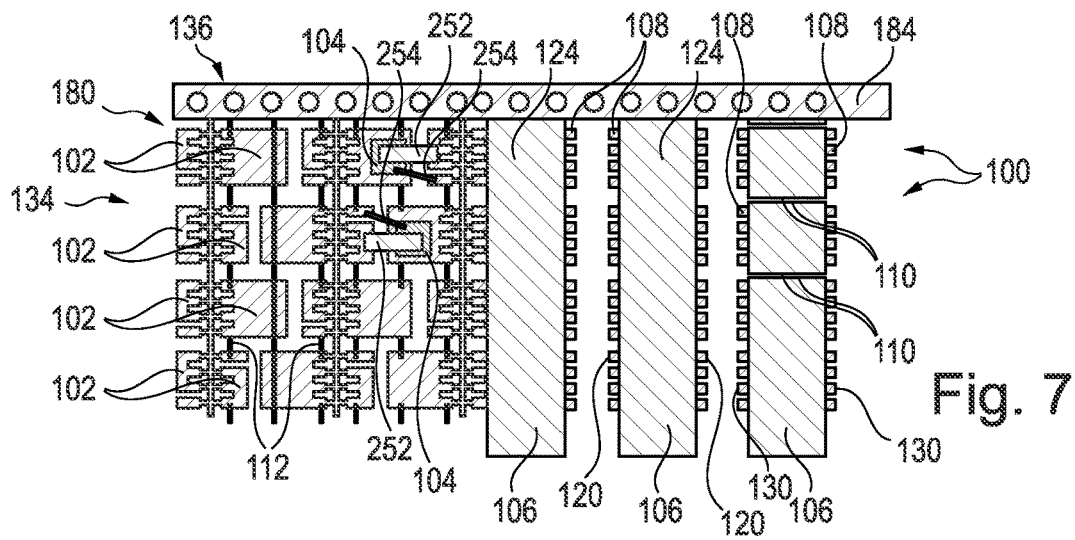
FIG. 7 illustrates a plan view of structures obtained during carrying out a method of manufacturing packages according to another exemplary embodiment.

FIG. 6 illustrates a plan view of structures obtained during carrying out a method of manufacturing packages 100 according to an exemplary embodiment. FIG. 7 illustrates a plan view of structures obtained during carrying out a method of manufacturing packages 100 according to another exemplary embodiment.

FIG. 6 and FIG. 7 show different tie bars 112 connecting different carriers 102 and extending vertically or in a slanted way. By the vertically extending tie bars 112, carriers 102 of a respective column 136 may be connected and stabilized. By slanted tie bars 112, even carriers 102 of adjacent columns 136 may be connected with each other. For singularization, the tie bars 112 may be removed by sawing and/or punching. According to FIG. 7, all tie bars 112 are oriented vertically. According to FIG. 6, some tie bars 112 are oriented vertically and other ones are oriented in a slanted way. Thus, it may be possible in exemplary embodiments to add thin tie bars 112 within a saw street to increase stability at the cost of a slightly reduced sawing speed. Consequently, all leads 108 may remain connected after lead bar punching. Plating for creating an LTI feature is possible.

Figure 8:
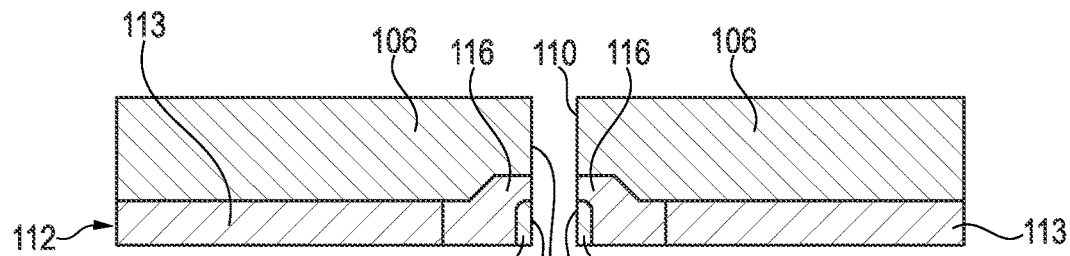
FIG. 8 illustrates a cross-sectional view of preforms of packages manufactured according to an exemplary embodiment.

FIG. 8 illustrates a cross-sectional view of preforms of packages 100 manufactured according to an exemplary embodiment. As shown in FIG. 8, a ratio between a surface area of an exposed tie bar section 112 at a respective side flank 110 and an entire surface area of the respective side flank 110 is quite small, for instance less than 10% or preferably less than 3%. This suppression of metal in the sawing street for obtaining a high sawing speed may be promoted by configuring the tie bar 112 with a thicker portion 113 in an interior of the encapsulant 106 and with a thinner portion 116 at the side flanks 110. Descriptively speaking, a coined tie bar 112 may be created according to FIG. 8. This may increase the sawing speed. Thus, a reduced amount of copper may be located within the saw street. The use of thick sawing blades (for instance having a thickness in the range from 100 μm to 400 μm, preferably from 300 μm to 400 μm) may be possible to regain dicing speed.

FIG. 8 thus illustrates how the amount of copper to be sawn in a sawing street can be further reduced. For this purpose, the tie bars 112 may be locally thinned where the sawing occurs. By the illustrated design of the tie bars 112, a high stability of the carriers 102 in the leadframe 180 may be combined with a fast and simple sawing process.

Figure 9:
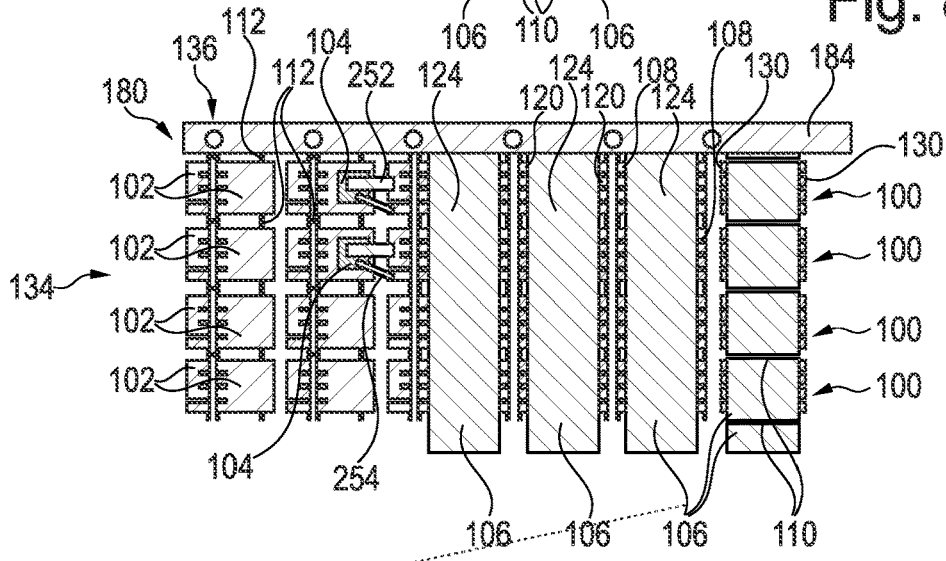
FIG. 9 illustrates a plan view of structures obtained during carrying out a method of manufacturing packages according to an exemplary embodiment.

FIG. 9 illustrates a plan view of structures obtained during carrying out a method of manufacturing packages 100 according to an exemplary embodiment.

The embodiment of FIG. 9 illustrates a pin side design of the leadframe 180. According to FIG. 9, some of the tie bars 112 are aligned vertically for connecting carriers 102 of a column 136. Others of the tie bars 112 have horizontally extending tie bar sections which may be removed by punching before sawing. By taking this measure, a high stability of the carriers 102 in the leadframe 180 may be combined with a fast and simple sawing, since tie bars 112 may be partially removed by punching carried out before the sawing.

The preferred embodiment of FIG. 9 corresponds to a pin-side design with only one tie bar 112 remaining at dicing. Others may be punched after plating.

Figure 10:
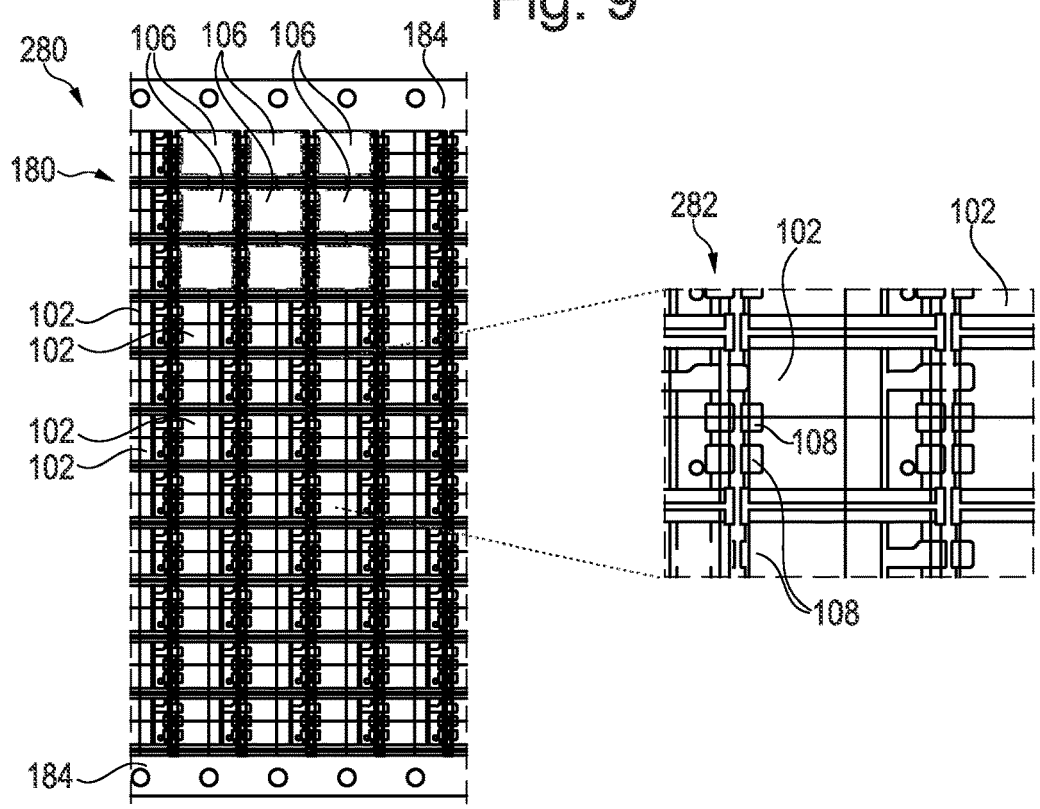
FIG. 10 illustrates an overview and a detail of a structure obtained during manufacturing packages according to an exemplary embodiment.

FIG. 10 illustrates an overview and a detail of a structure obtained during manufacturing packages 100 according to an exemplary embodiment.

The illustration in FIG. 10 with an overview 280 and a detail 282 of a leadframe 180 again shows that all leads 108 extend horizontally along vertical side flanks of the carriers 102 and that the horizontal side flanks of the carriers 102 are free of leads 108.

Figure 11:
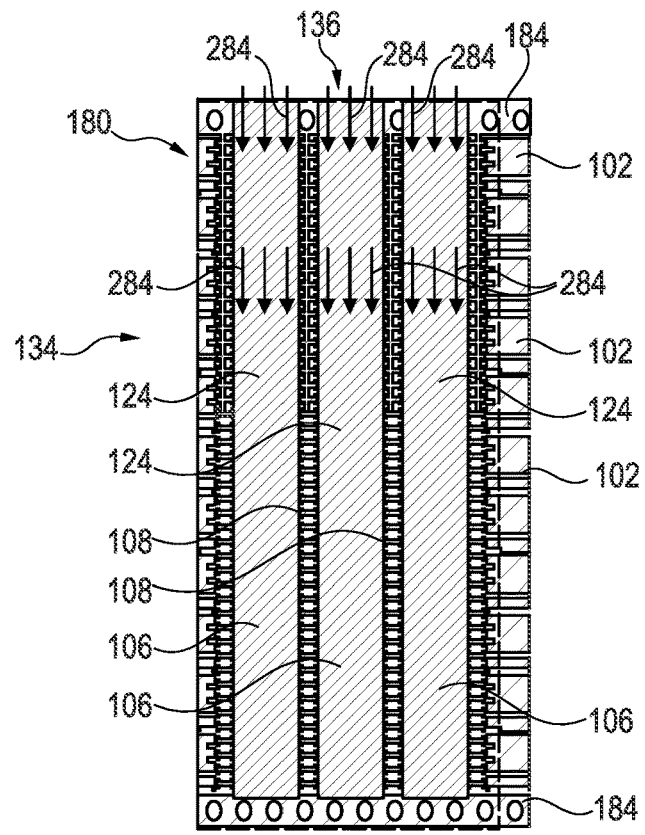
FIG. 11 illustrates a plan view of a structure obtained during carrying out a method of manufacturing packages according to an exemplary embodiment.

FIG. 11 illustrates a plan view of a structure obtained during carrying out a method of manufacturing packages 100 according to an exemplary embodiment.

As illustrated by arrows 284 in FIG. 11, a strip-wise molding can be carried out using a barcode shaped cavity. As a consequence, the parallel aligned and spaced encapsulant bars 124 may be formed without the requirement of complex runners and with relaxed requirements concerning gates.

Figure 12:
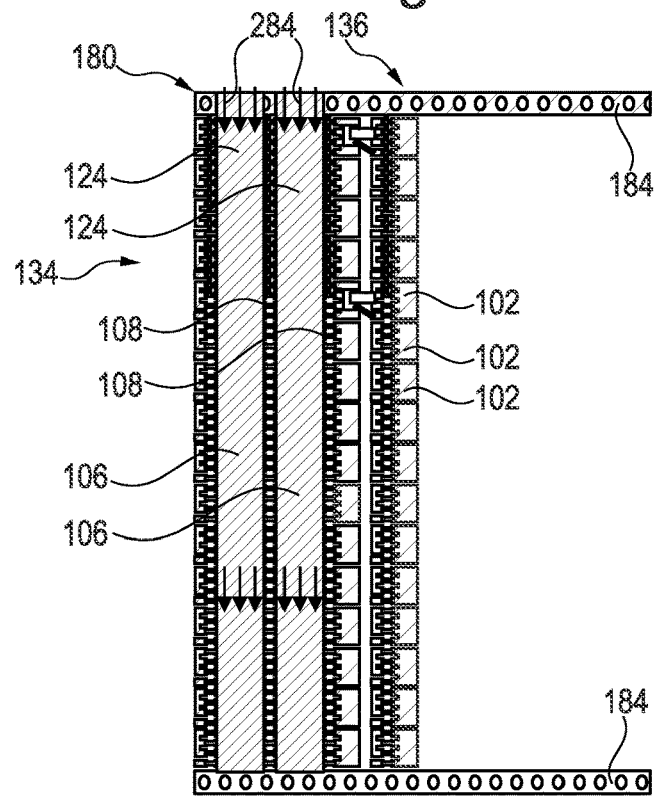
FIG. 12 illustrates a plan view of a structure obtained during carrying out a method of manufacturing packages according to another exemplary embodiment.

FIG. 12 illustrates a plan view of a structure obtained during carrying out a method of manufacturing packages 100 according to an exemplary embodiment. This embodiment provides a very simple mold flow design which enables processing of standard sized leadframe designs (60 mm to 70 mm×250 mm), but also larger, panel-sized leadframes for instance 300 mm×100 mm.

FIG. 12 illustrates that the architecture described above can be properly scaled in the vertical direction. For instance, the arrangement shown in FIG. 11 may have an extension in horizontal direction of for example 300 mm, wherein a dimension in vertical direction may for example be 60 mm to 70 mm. According to FIG. 12, the dimension in vertical direction may be for example 100 mm, whereas the extension in horizontal direction may be for example 300 mm. Thus, exemplary embodiments are properly scalable to different panel dimensions.

Figure 13:
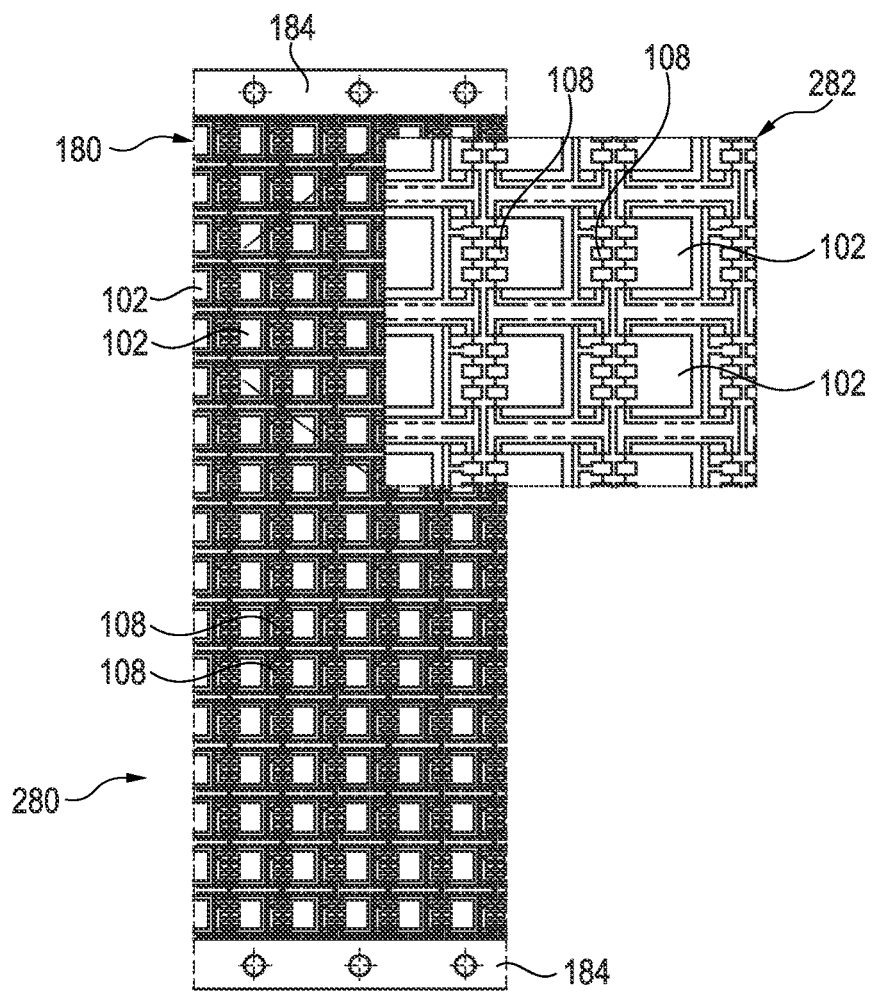
FIG. 13 illustrates an overview and a detail of a structure obtained during manufacturing packages according to an exemplary embodiment.

FIG. 13 illustrates an overview 280 and a detail 282 of a structure obtained during manufacturing packages 100 according to an exemplary embodiment.

Figure 14:
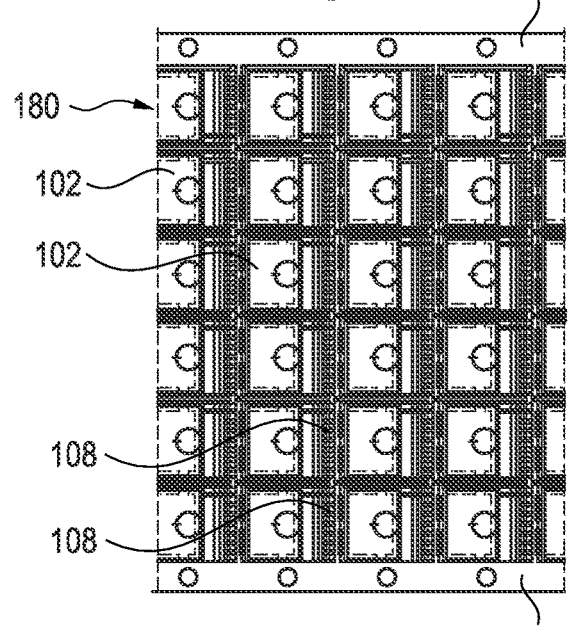
FIG. 14 illustrates a plan view of a structure obtained during carrying out a method of manufacturing packages according to an exemplary embodiment.

FIG. 14 illustrates a plan view of a structure obtained during carrying out a method of manufacturing packages 100 according to another exemplary embodiment.

As illustrated by FIG. 13 and FIG. 14, exemplary embodiments may be adapted for very different package types. The embodiment of FIG. 13 corresponds to a TSDSON-8 design of the S3O8 package platform, whereas the embodiment of FIG. 14 relates to a HSOF design of the TOLL package platform.

Figure 15:
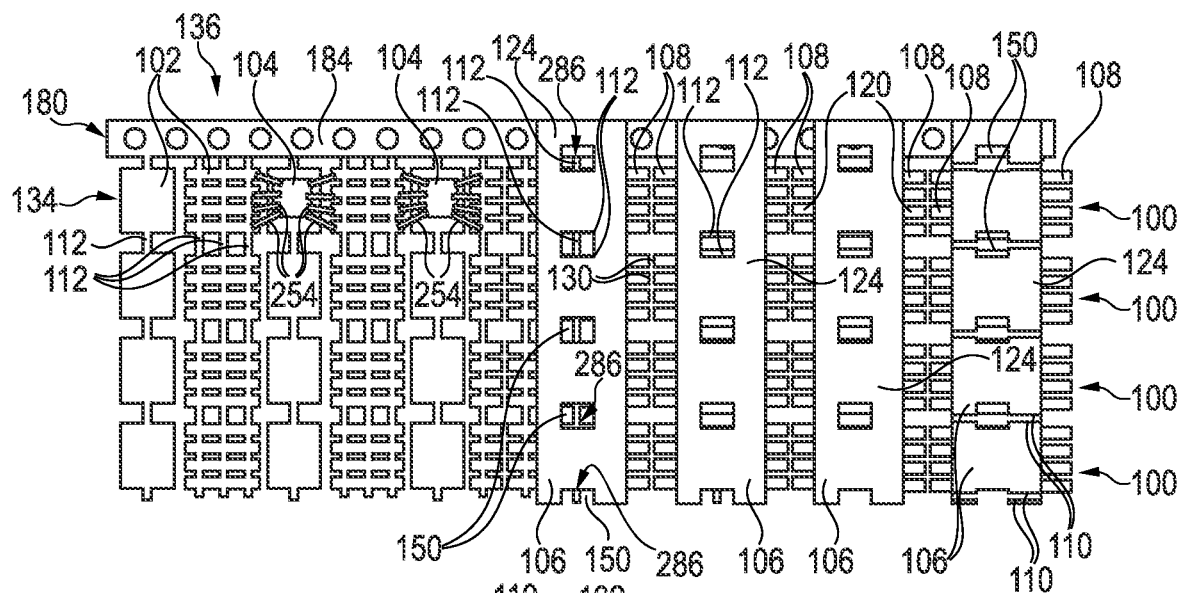
FIG. 15 illustrates a plan view of structures obtained during carrying out a method of manufacturing packages according to an exemplary embodiment.

FIG. 15 illustrates a plan view of structures obtained during carrying out a method of manufacturing packages 100 according to still another exemplary embodiment. This embodiment corresponds to punching of tie- and lead bar within mold windows.

FIG. 15 shows a DSO package design with die pad and leads 108 as respective carrier 102. According to FIG. 15, encapsulant windows 286 may be formed in the mold-type encapsulant bars 124. These windows 286 may thus be denoted as mold windows. Within the mold windows 286, it is possible to remove metallic tie bars 112 and/or lead bars by punching, to thereby simplify a subsequent sawing process. After sawing, recesses 150 are formed at edges of the obtained packages 100 due to the presence of the previous windows 286.

Figure 16:
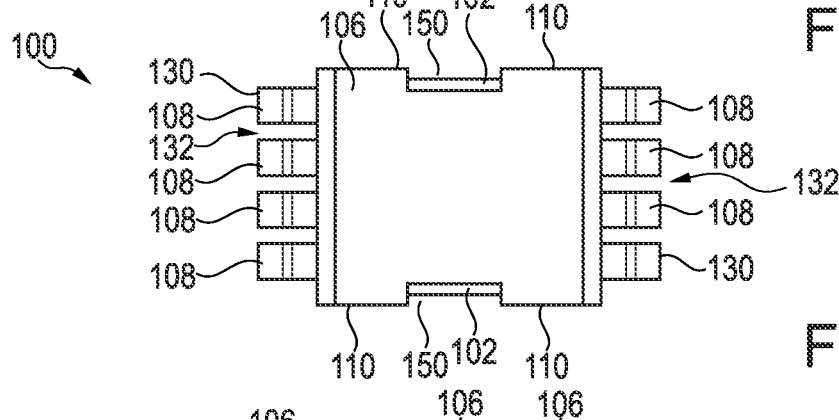
FIG. 16 illustrates a plan view and FIG. 17 illustrates a side view of a package according to an exemplary embodiment.
Figure 17:
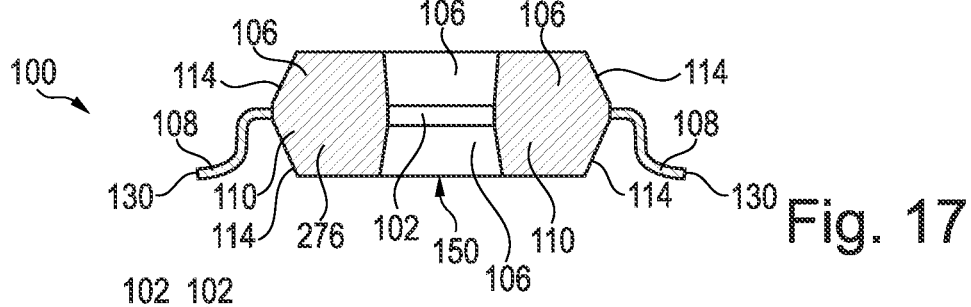

FIG. 16 illustrates a plan view and FIG. 17 illustrates a side view of a package 100 according to an exemplary embodiment. In the embodiment of FIG. 16 and FIG. 17, the encapsulant 106 has two recesses 150 in a central portion of each of the two opposing side flanks 110. Thus, each of the sawn surfaces may be provided with a respective recess area.

Thus, the formation of the mold windows 286 followed by a punching process of removing tie bars 112 in the respective window 286 may result in the formation of recesses 150 in the side flanks 110 defined by sawing. In other words, the side flanks 110 according to FIG. 16 and FIG. 17 are formed partially by sawing, namely the exterior sections of side flanks 110. In contrast to this, a respective central section of the side flank 110 at which the respective recess 150 is formed, is defined by molding and punching rather than by sawing. Referring to the texture of the sawn surface 276 of package 100 shown in FIG. 16 and FIG. 17, reference is made to reference numeral 281 described referring to FIG. 5.

Figure 18:
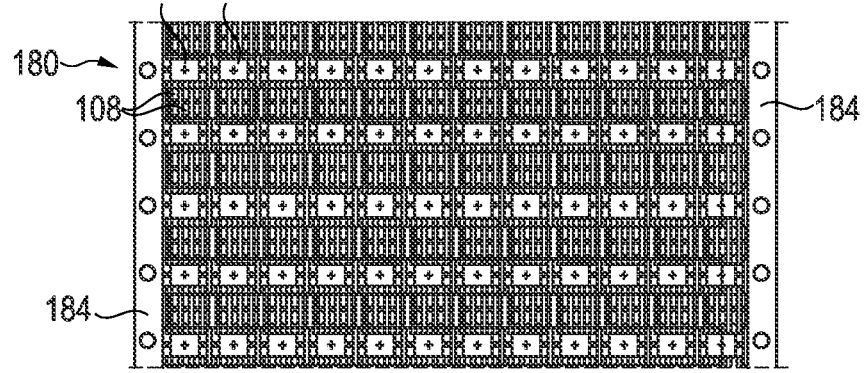
FIG. 18 illustrates a plan view of a structure obtained during carrying out a method of manufacturing packages according to an exemplary embodiment.

FIG. 18 illustrates a plan view of a structure obtained during carrying out a method of manufacturing packages 100 according to another exemplary embodiment. FIG. 18 shows a leadframe 180 in accordance with a DSO-package design.

Figure 19:
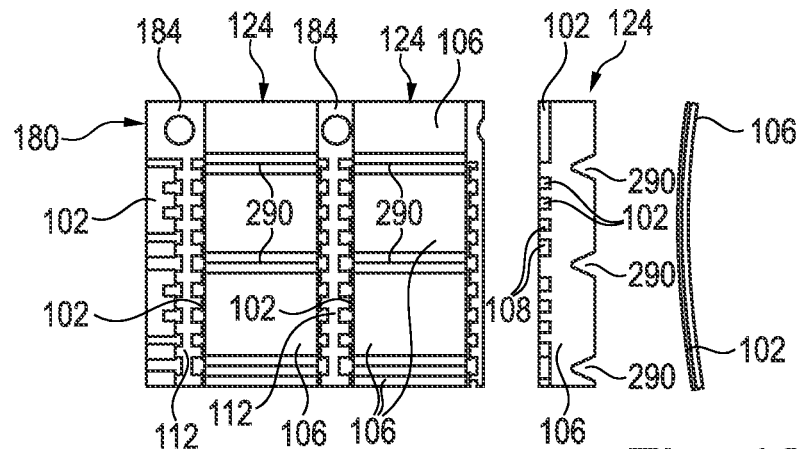
FIG. 19 illustrates different views of structures obtained during carrying out a method of manufacturing packages according to an exemplary embodiment.

FIG. 19 illustrates different views of structures obtained during manufacturing packages 100 according to an exemplary embodiment. FIG. 19 shows details relating to a barcode-type cavity molding. Any potential bow issues may be reduced by molded V-grooves 290 in encapsulant 106, as will be described in the following in further detail.

Under undesired circumstances it may happen that a barcode cavity mold design resulting in encapsulant bars 124 may involve bow issues. FIG. 19 shows an embodiment which is capable of strongly suppressing any tendency of bowing. As shown in the plan view and the cross-sectional view of the illustrated partially processed leadframe 180 it is possible to form grooves 290 at positions at which the processed leadframe 180 is later singularized into the individual packages 100 by sawing. These grooves 290, which are preferably V-shaped, may therefore reduce the sawing depth, may simplify the sawing process and may strongly suppress bowing, as indicated schematically on the right-hand side of FIG. 19.

Figure 20:
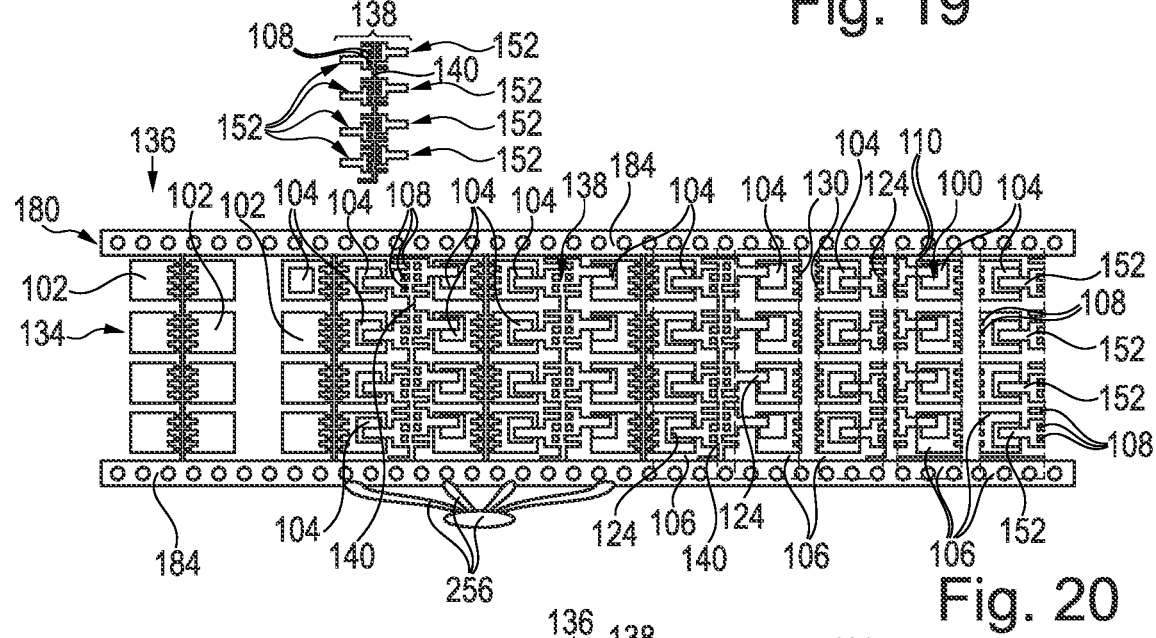
FIG. 20 illustrates a plan view of a structure obtained during carrying out a method of manufacturing packages according to an exemplary embodiment.

FIG. 20 illustrates a plan view of a structure obtained during carrying out a method of manufacturing packages 100 according to another exemplary embodiment.

According to the embodiment of FIG. 20, the illustrated leadframe 180 comprises clipframes 138 each comprising a plurality of integrally formed clips 152 for the carriers 102 and extending in the transverse dimension between two adjacent columns 136 of carriers 102 of the leadframe 118. More specifically, each of the clipframes 138 comprises a central tie bar 140 extending in the transverse direction and comprises clips 152 on both opposing sides of the central tie bar 140. The illustrated clipframes 138 may be connected to the carriers 102 (or more precisely to electronic components 104 mounted on the respective carriers 102) between two adjacent columns 136 of the leadframe 180. Said connection of the clipframes 138 to the carriers 102 may be established by a mechanical plug mechanism. However, it is for instance possible to provide an electrically conductive paste, for instance solder paste, at an interface between the leadframe 180 and a respective clipframe 138. By connecting the clipframes 138 to the leadframe 180, each clip 152 of the clipframe 138 may be simultaneously connected to a respective one of the electronic components 104 assembled on the carriers 102. After said connection process, the method comprises separating the clipframe 138 into the individual clips 152 by the punching process which separates or singularizes the individual packages 100. More specifically, the method may comprise separating the clipframe 138 into the clips 152 by removing the tie bars 140 connecting adjacent clips 152 of a respective clipframe 138 by punching.

Highly advantageously, each respective clip 152 may integrally include (and thereby provide to a respective package 100) leads 108 (which may hence form an integral part of a respective clip 152). Consequently, a direct physical connection exists between the component contacting portion of a respective clip 152 and the leads 108. A portion of the three-dimensionally bent clips 152, which portion provides the integral leads 108, may be arranged at the same vertical level as the carrier 102.

Thus, the embodiment of FIG. 20 provides a parallel clip mounting concept based on the insertion of electronic clipframes 138 in a leadframe 180. This may allow establishing an electrical connection between the leadframe 180 and the clipframe 138 which also advantageous for creating LTI plating. It is also possible to provide an electrical connection by a wire bond or by a conductive glue or by a solder connection.

Concerning the embodiment of FIG. 20, a reference is made to the detailed description of FIG. 3. In the following, the differences of the manufacturing concept according to FIG. 20 compared with FIG. 3 will be explained. According to FIG. 20, clipframes 138 are provided having an arrangement of a plurality of clips 152 arranged on both sides of a clip tie bar 140 which extends vertically. Thus, on each side of the clip tie bar 140, a linear arrangement of vertically extending clips 152 is provided. Due to the butterfly configuration of the clipframe 138 according to FIG. 20, a respective clip 102 is formed on each of the left-hand side and the right-hand side of the clip tie bar 140.

Although the clipframe 138 according to FIG. 20 shows a certain degree of anisotropy, it is also possible that the clipframe 138 is provided axially symmetric with respect to a central axis defined by the clip tie bar 140. Handling of the clipframe 138 is then particularly failure robust.

The illustrated clipframe 138 may be connected to the leadframe 180 in the way as shown in FIG. 20 so that respective clips 152 are connected on upper main surfaces of the surface-mounted electronic components 104 which have previously been mounted on die pads of the carriers 102. Highly advantageously, the clips 152 of the clipframe 138 already comprise structures which later form leads 108. In other words, clips 152 with integrally formed leads 108 may be provided. After molding, by which encapsulant bars 124 are formed in the fashion described above, exposed clip tie bars 140 between adjacent encapsulant bars 124 may be removed by punching. Subsequently, the packages 100 may be singularized by horizontally sawing.

Figure 21:
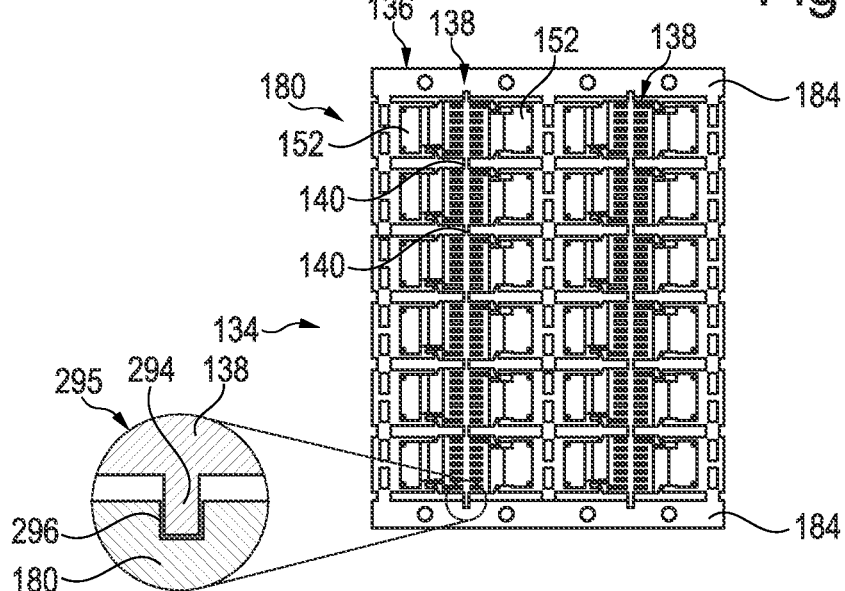
FIG. 21 illustrates a plan view of a structure obtained during carrying out a method of manufacturing packages according to an exemplary embodiment.

FIG. 21 illustrates a plan view of a structure obtained during carrying out a method of manufacturing packages 100 according to an exemplary embodiment.

FIG. 21 shows a leadframe 180 with clipframes 138 which may be simply plugged into the leadframe 180. A clipframe 138 may be connected manually or in an automated manner by establishing simply a form closure between cooperating connection structures 294 of the clipframe 138 and 296 of the leadframe 180. In the shown embodiment and as illustrated in a detail 295, connection structure 294 may be a pin, whereas connection structure 296 may be a corresponding recess. This may be embodied vice versa as well.

Figure 22:
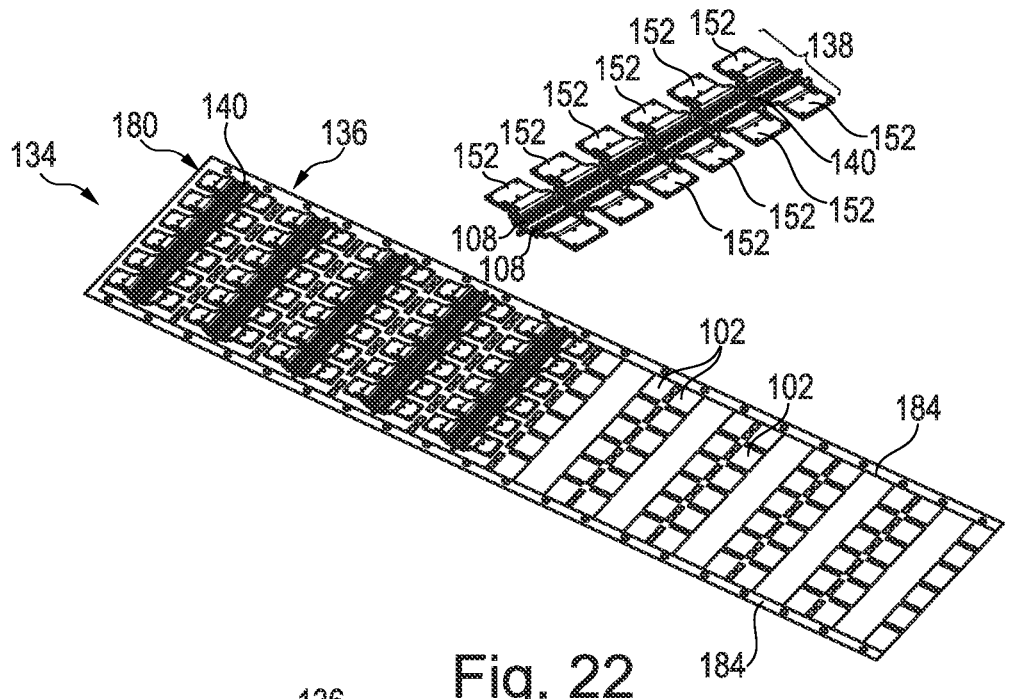
FIG. 22 illustrates a three-dimensional view of a structure obtained during carrying out a method of manufacturing packages according to an exemplary embodiment.
Figure 23:
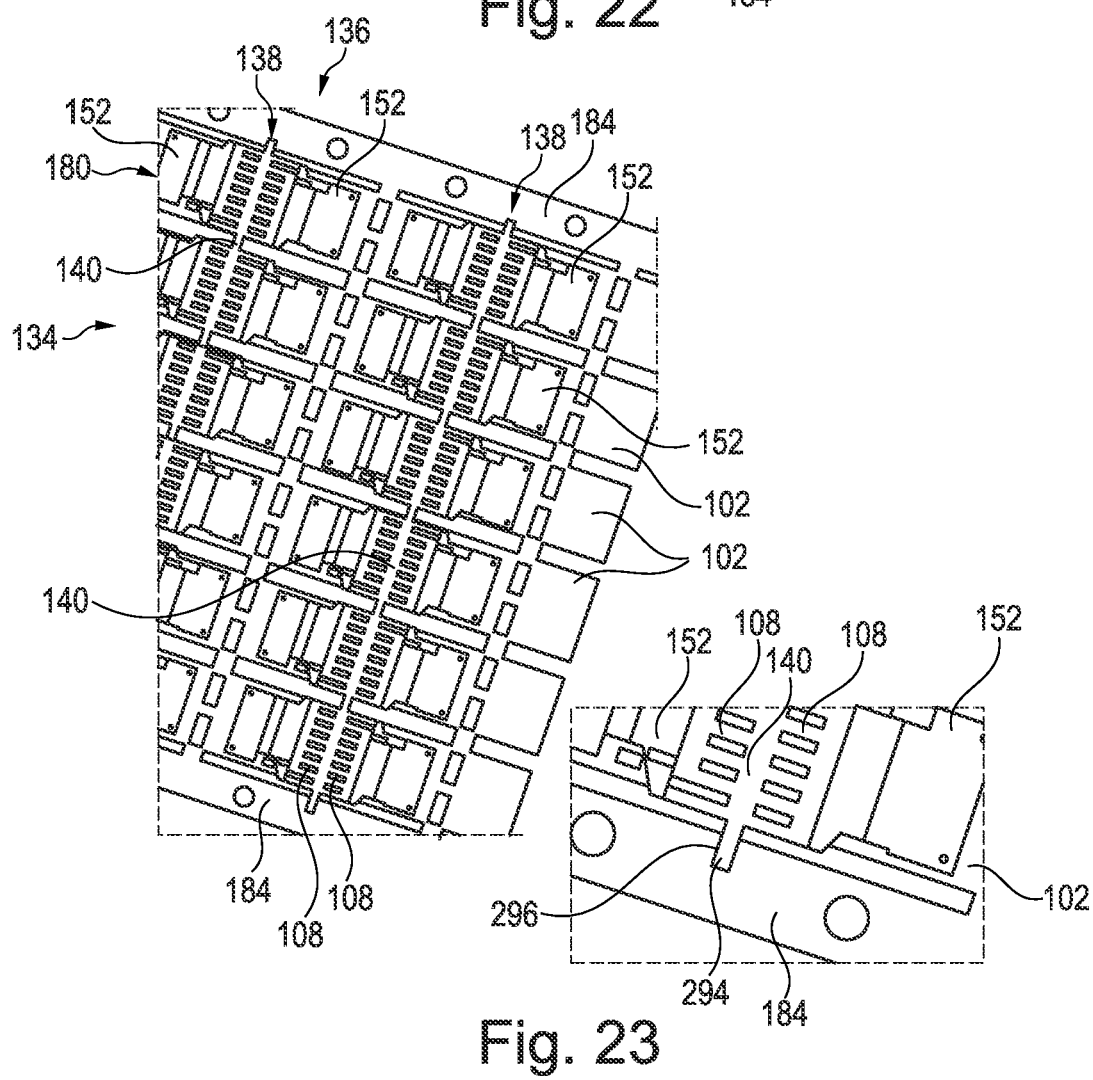
FIG. 23 illustrates details of the structure according to FIG. 22.

FIG. 22 illustrates a three-dimensional view of a structure obtained during carrying out a method of manufacturing packages 100 according to an exemplary embodiment. FIG. 23 illustrates details of the structure according to FIG. 22. FIG. 22 and FIG. 23 relate to the connection of a butterfly-type clipframe 138 to a leadframe 180.

An electrical connection needed for electroplating may be established between clipframe 138 and leadframe 180. For instance, an electric connection may be created by printed solder paste on a slit of the leadframe 180. A pin or rod of the clipframe 138 may slide through solder paste and may smear it down. Additional dambars may be optionally provided for higher stability and better molding. In a cross section with a single bending direction, a rolled part may be possible. In particular, strip Ag-plating may be possible in an embodiment.

FIG. 22 illustrates the butterfly arrangement of clipframe 138. The actual clips 152 are provided vertically raised so as to be attachable to upper main surfaces of the electronic components 104. Lower lead portions of the clips 152 comprising integrally formed leads 108 may be arranged at the same vertical level as the carriers 102 when the clipframe 138 is mounted in the leadframe 180.

FIG. 24 illustrates a three-dimensional view of a clipframe 138 used for manufacturing packages 100 according to an exemplary embodiment. FIG. 25 illustrates a cross-sectional view of a clipframe 138 for packages 100 according to an exemplary embodiment. FIG. 26 illustrates a plan view of a structure obtained during carrying out a method of manufacturing packages 100 according to an exemplary embodiment. According to FIG. 26, the clipframes 138 are assembled to the leadframe 180. FIG. 27 illustrates a cross-sectional view of a part of a package 100 according to an exemplary embodiment created using a clip 152 of a clipframe 138.

For using the electrically conductive clips 152, no solder and double copper layer in a lead terminal area is necessary. In order to manufacture the leadframe 180 with low effort, with high density and in a scalable manner, it may be possible to create the latter by stamping with corresponding recesses. A respective clipframe 138 may be used as an insertion part to be inserted into corresponding recesses of the leadframe 180 to obtain a high density clipframe manufacturing process flow. Punching (and optionally sawing) of tie bars 112, 140 may be performed for both leadframe 180 and clipframe 138, preferably process. An obtained package 100 or device may have a two-sided sawn surface texture, a two-sided mold cavity surface texture and an electric clip 152. In particular, such a package 100 or device may have punched leads 108 and sawn side flanks as well as an electric clip 152.

The leads 108 of the clipframe 138 may be individualized by punching away clip tie bar 140. FIG. 24 to FIG. 26 show further details of the described arrangement. A cross-sectional view of a corresponding package 100 is shown in FIG. 27.

Figure 28:
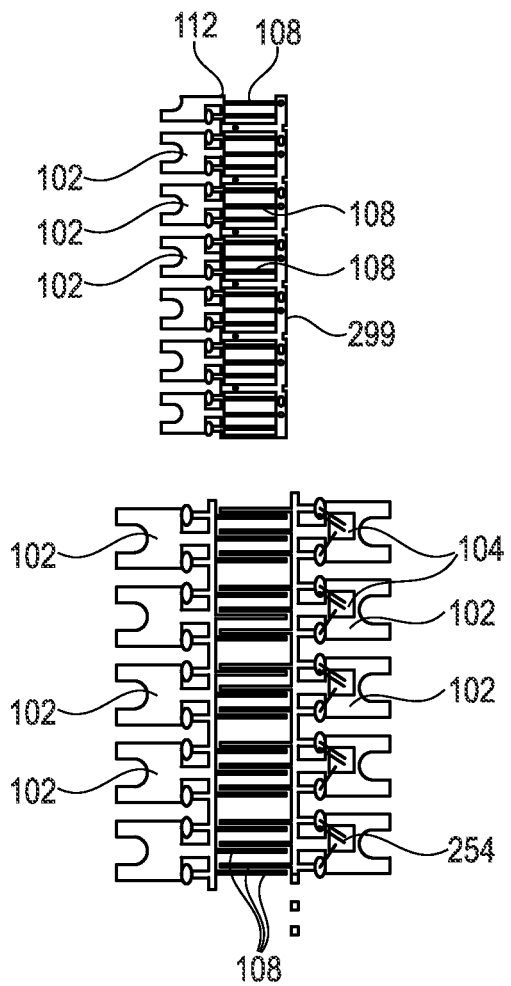
FIG. 28 illustrates a plan view of structures obtained during carrying out a method of manufacturing packages according to an exemplary embodiment.

FIG. 28 illustrates a plan view of structures obtained during carrying a method of manufacturing packages 100 according to an exemplary embodiment.

In particular for manufacturing dual gage packages 100 (such as packages 100 having sections of the carrier 102 with different thickness), a space-saving interdigitate design of leads 108 is advantageous. In particular, an inlay-type leadframe 180 may be highly efficient in terms of space-saving. Such a concept may be advantageously combined with single lane dicing (preferably in a metal free manner).

FIG. 28 illustrates how a conventional leadframe can be processed so as to render it compatible with a manufacturing process flow according to an exemplary embodiment. The embodiments described in the following refer to packages 100 having leads 108 extending only out of one side flank 110 of an encapsulant 106. As shown, carriers 102 with already readily manufactured leads 108 (i.e. already having free ends) is provided together with tie bar structures 112. Two of the bodies shown in the upper portion of FIG. 28 may be combined to form the structure shown in the lower portion of FIG. 28. For this purpose, connection structures 299 may be removed, and one of the two obtained structures is turned by 180°. As shown, electronic components 104 may be mounted on die pads of the carriers 102 and may be connected by bond wires 254. As a result, an interdigitate design is obtained which can be manufactured in a space-saving way. Descriptively speaking, such an interdigitate design has leads 108 which are connected as interleaving finger structures.

Figure 29:
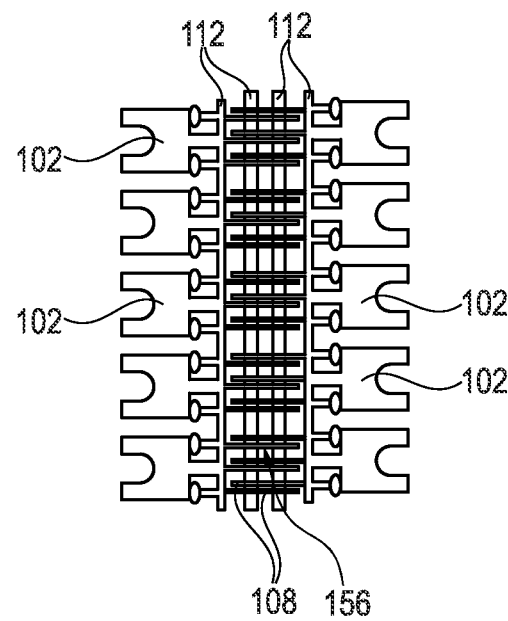
FIG. 29 illustrates a plan view of a structure obtained during carrying out a method of manufacturing packages according to an exemplary embodiment.

FIG. 29 illustrates a plan view of another structure obtained during carrying out a method of manufacturing packages 100 according to an exemplary embodiment. According to said embodiment, the method may comprise connecting the leads 108 by perpendicular tie bars 112, in particular by forming a mesh structure 156 composed of the leads 108 and the tie bars 112. Thus, FIG. 29 shows another embodiment of a leadframe or leadframe portion used according to another exemplary embodiment. The configuration of FIG. 29 has a mesh structure 156 of tie bars 112 and leads 108.

Both structures shown in FIG. 28 and FIG. 29 can be used as a basis for carrying out a manufacturing process as described above referring to FIG. 3 or FIG. 20.

Figure 30:
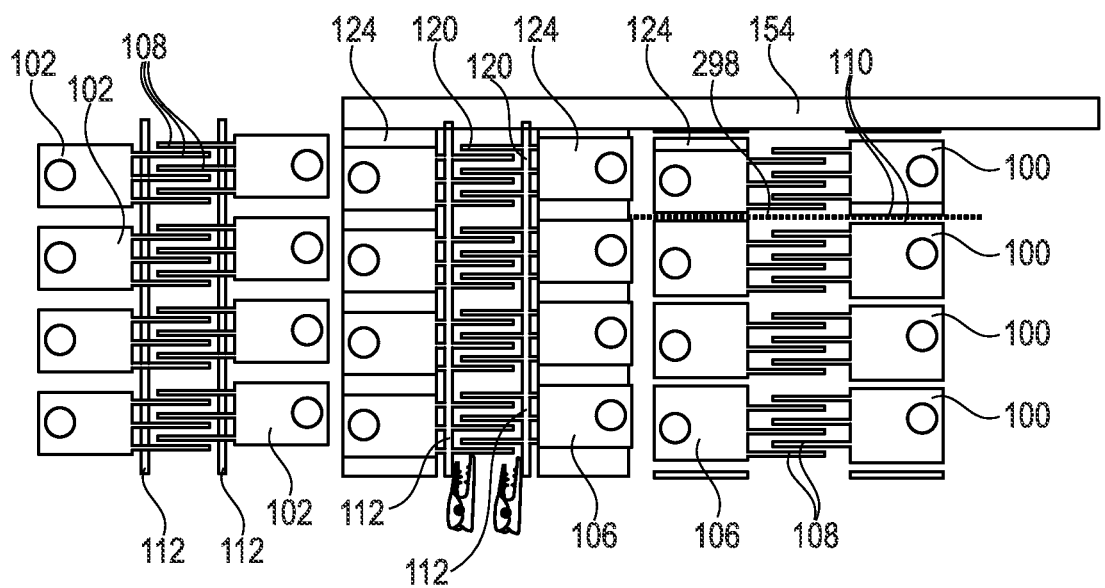
FIG. 30 illustrates a plan view of structures obtained during carrying out a method of manufacturing packages according to an exemplary embodiment.

FIG. 30 illustrates a plan view of structures obtained during carrying out a method of manufacturing packages 100 according to an exemplary embodiment.

In such an embodiment, the method comprises forming and connecting the above described encapsulant bars 124 by a right-angled or perpendicular auxiliary bar 154 of material of the encapsulant 106. Moreover, the leads 108 may be punched by removing a plurality of non-continuous sections of material of the tie bars 112. Thereafter, singularization by sawing may be carried out, as described above. As shown, the described method comprises arranging the leads 108 in an interdigitate fashion.

After the punched leadlength cut, the multi-package ensembles are placed in the mold tool to yield an interdigitated leadframe design. After bar code molding (including a connecting top mold bar), electro plating is conducted using multiple, crocodile-type, electrical connections. Thereby, placing layers 120 may be formed. Singulation may then be performed by punching (for separating leads 108) and saw singulation (on top and bottom sides of the obtained packages 100).

FIG. 30 shows details of a possible manufacturing process. A structure according to the bottom view of FIG. 28 may be used and may be processed by encapsulating, in particular by molding. By such a molding process, encapsulant bars 124 can be manufactured in the way as described above. However, multiple spaced and separate encapsulant bars 124 may be connected with each other by a horizontally extending auxiliary bar 154 which may be made of the same encapsulant material, in particular may be formed with a simultaneous molding process during which also the encapsulant bars 124 are formed. Thereafter, it is possible to plate the exposed portions of the leads 108, for instance with a solderable material such as tin. After that, it is possible to remove unconnected sections of the tie bars 112 by punching. Further subsequently, the individual mold bars 124 with encapsulated carriers 102 and electronic components 104 may be singularized by horizontally sawing along a sawing trajectory which is indicated schematically by reference sign 298 in FIG. 30.

Figure 31:
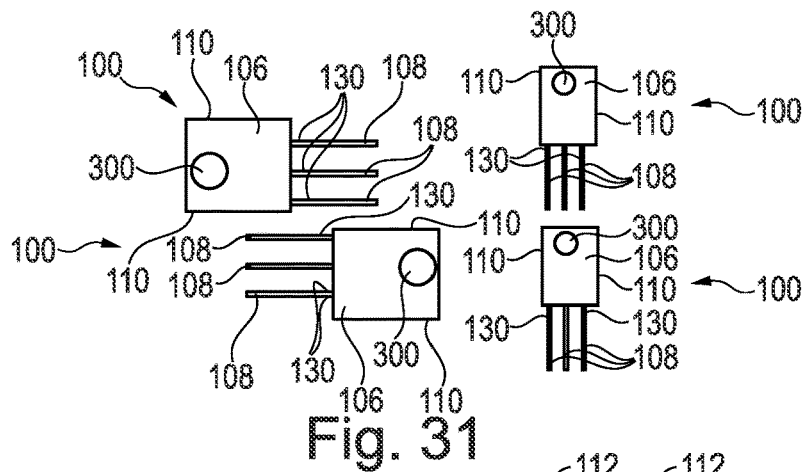
FIG. 31 illustrates a plan view of packages according to an exemplary embodiment.

FIG. 31 illustrates a plan view of packages 100 with asymmetric design (more specifically with asymmetric left-right-design) according to an exemplary embodiment.

As a result of a manufacturing process according to FIG. 28 and FIG. 30, the packages 100 illustrated in FIG. 31 may be obtained. As shown, and as a consequence of the described manufacturing process, an asymmetric design of the packages 100 according to the left-hand side and the right-hand side of the lower image of FIG. 28 can be obtained. Punched surface portions of the leads 108 may now be oriented at side surfaces thereof rather than at a flange surface thereof, as indicated by reference numeral 130 in FIG. 31.

Furthermore and as indicated by reference sign 300 in FIG. 31, the packages 100 may have a mounting recess by which they can be connected to an electronic environment, for instance can be screwed on a heat sink or a printed circuit board.

FIG. 32 to FIG. 36 illustrate plan views of structures obtained during carrying out a method of manufacturing packages 100 according to an exemplary embodiment.

Figure 32:
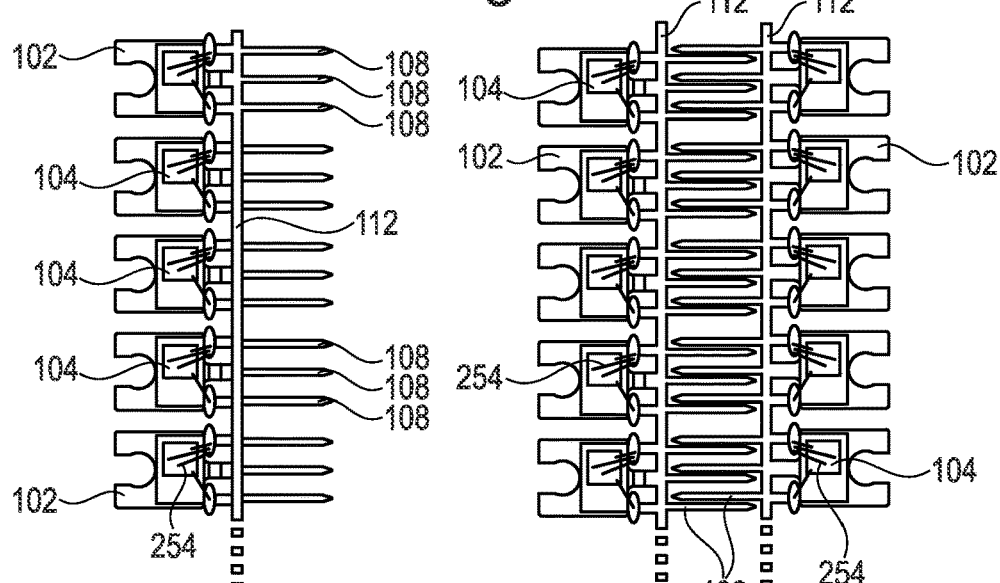
FIG. 32 to FIG. 36 illustrate plan views of structures obtained during carrying out a method of manufacturing packages according to an exemplary embodiment.

Referring to FIG. 32, a standard leadframe is shown which may be used as the basis for the subsequent manufacturing process. A leadlength cut may be executed.

Figure 33:
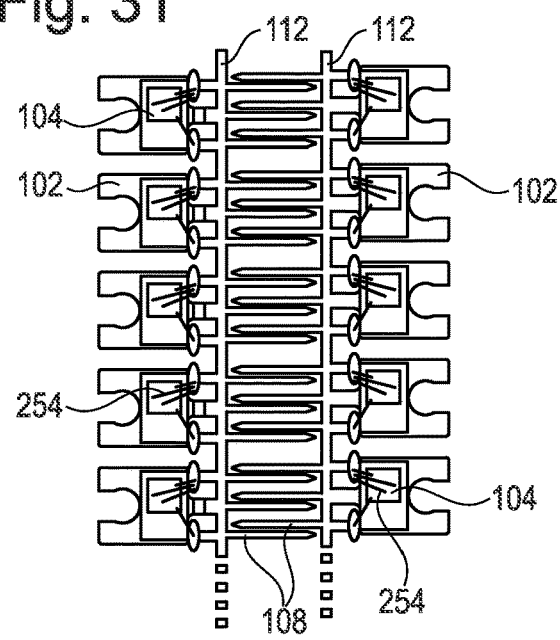

Referring to FIG. 33, an arrangement of two interdigitate leadframes obtained according to a FIG. 32 is shown which may then be made subject to transfer molding.

Figure 34:
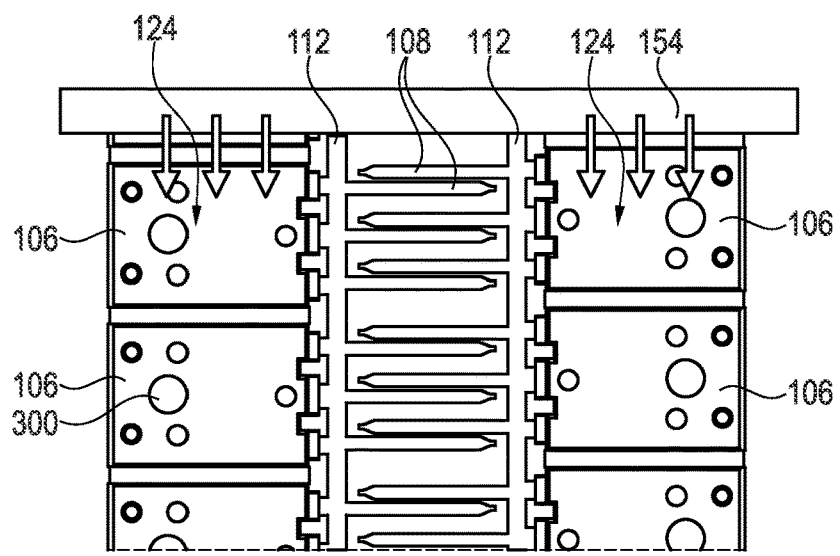

Referring to FIG. 34, transfer bar molding may be carried out.

Figure 35:
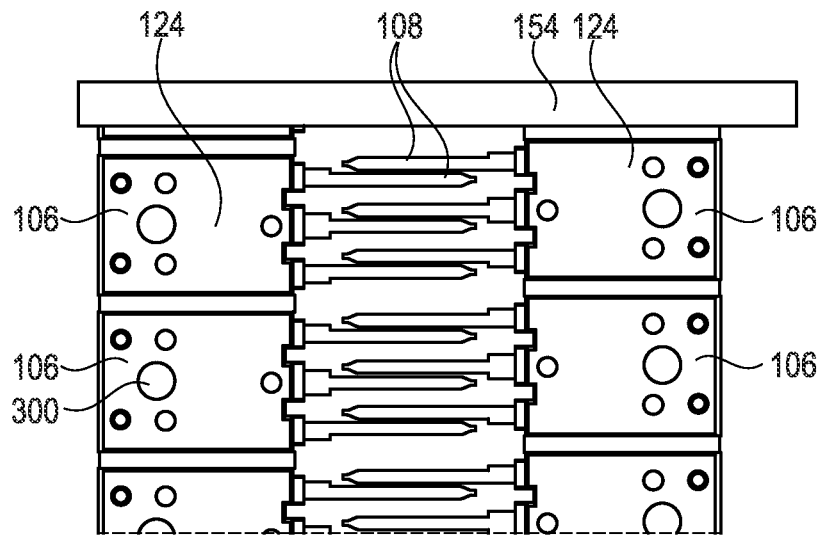

Referring to FIG. 35, punched surfaces 130 are created by punching. Said punched surfaces 130 may be punched side surfaces of the leads 108. As shown, the leads 108 may be locally thickened at the punched side surface.

Figure 36:
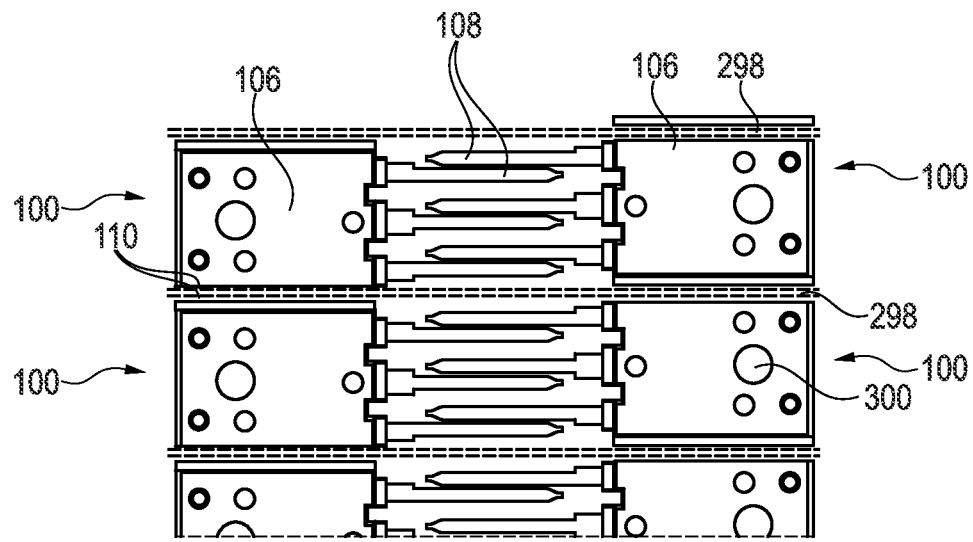

Referring to FIG. 36, dicing may then be carried out, preferably in a copper free manner.

FIG. 32 shows a leadframe structure which can be obtained by carrying out a leadlength cut from a standard leadframe of the TO247 package type, as described above referring to FIG. 28. Two such structures as shown in FIG. 32 may be interleaved in order to form interdigitated leads 108, as shown in FIG. 33. The structure of FIG. 33 may then be made subject to a comparable molding routine as shown above. As shown in FIG. 34, encapsulant bars 124 and optionally also an auxiliary bar 154 (compare FIG. 30) may be formed. By punching, the structure shown in FIG. 35 can be obtained. During such a punching process, non-continuous or non-consecutive portions of the tie bars 112 are removed and the individual leads 108 of a respective package 100 may be separated from each other. Thereafter and as shown in FIG. 36, an advantageously copper-free dicing or sawing only through material of the mold type encapsulant 106 is carried out. This allows high-speed and simple sawing.

Figure 37:
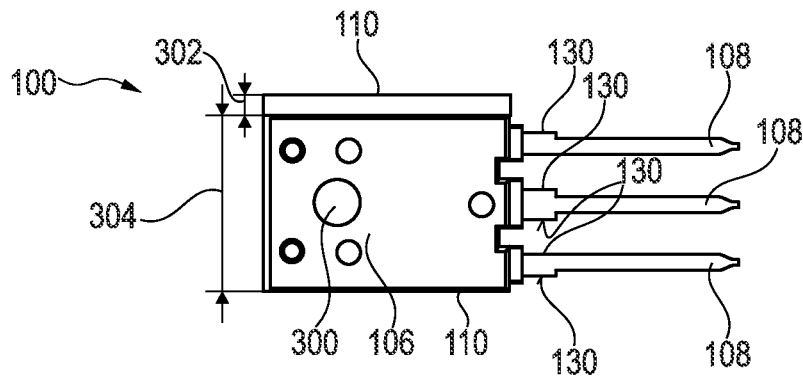
FIG. 37 illustrates a plan view of a package according to an exemplary embodiment obtained by carrying out a method of manufacturing packages according to FIG. 32 to FIG. 36.

FIG. 37 illustrates a plan view of a finished package 100 according to an exemplary embodiment obtained by carrying out a method of manufacturing packages 100 according to FIG. 32 to FIG. 36.

FIG. 37 shows a package 100 obtained by the described manufacturing process. A slight asymmetry of the encapsulant 106 allowing to distinguish between left-hand side packages 100 and right-hand side packages 100 is indicated by reference numeral 302. Encapsulant portion corresponding to reference numeral 304 is the same for the left-hand side packages 100 and the right-hand side packages 100.

Figure 38:
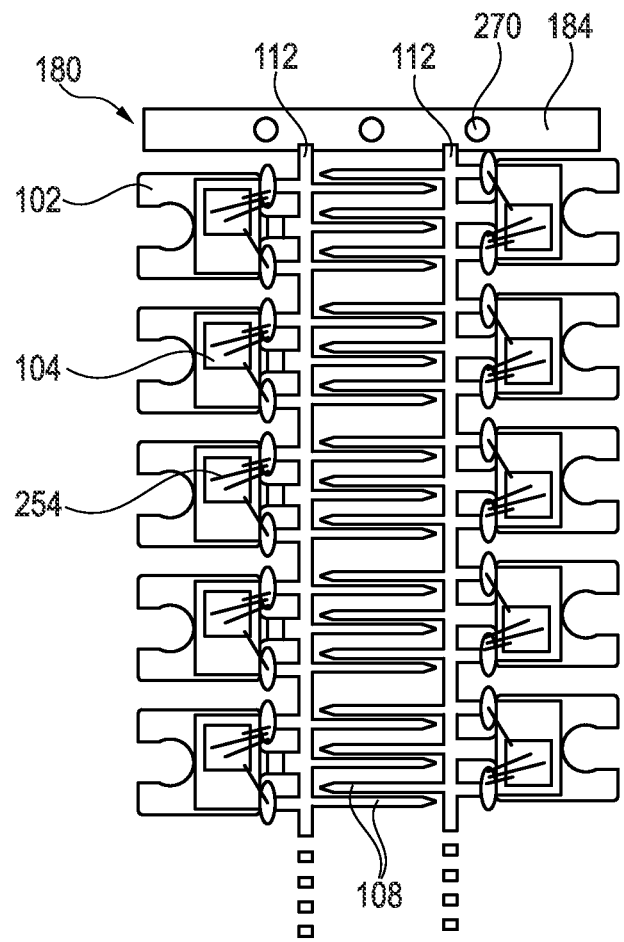
FIG. 38 illustrates a plan view of a structure obtained during carrying out a method of manufacturing packages according to an exemplary embodiment.

FIG. 38 illustrates a plan view of a structure obtained during carrying out a method of manufacturing packages 100 according to an exemplary embodiment. Standard leadframes which may be used as a starting point for a manufacturing process according to an exemplary embodiment may be arranged (for instance by laser welding) on an index strip 184 having the function as described above.

The structure of FIG. 32 may be used for creating the structure shown in FIG. 38 (being similar to FIG. 33). For this purpose, two structures shown in FIG. 32 may be arranged on index strip 184 to thereby form a leadframe 180. Connection with the index strip 184 may be accomplished for instance by laser welding.

Figure 39:
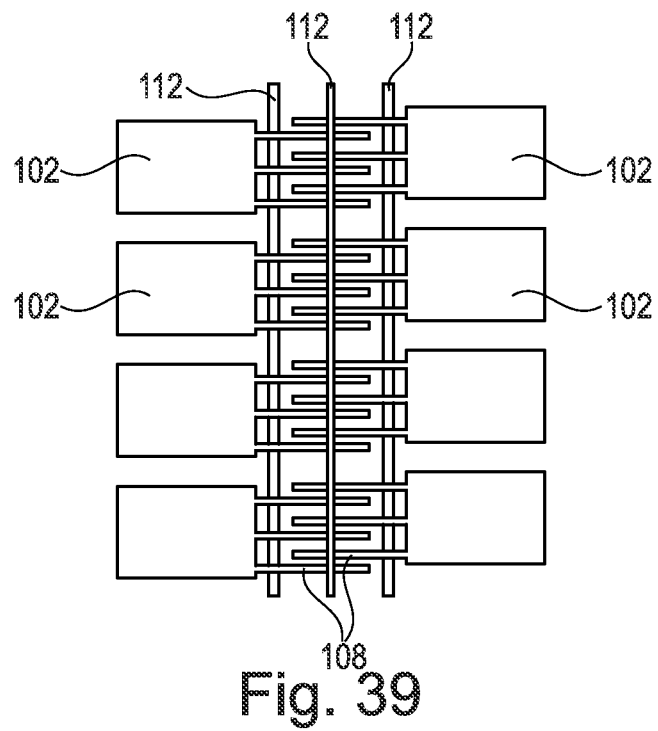
FIG. 39 illustrates a plan view of a structure obtained during carrying out a method of manufacturing packages according to an exemplary embodiment.

FIG. 39 illustrates a plan view of a structure obtained during carrying out a method of manufacturing packages 100 according to an exemplary embodiment.

Instead of using a standard dual gage leadframe design as a starting point, an inlay frame may be used where interdigitated leads 108 are already created. This may have the advantage of a particularly space saving architecture. FIG. 39 shows such an alternative leadframe inlay design which can be used according to exemplary embodiments as well.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

The invention claimed is:

1. A method of manufacturing a package, the method comprising:
   mounting an electronic component on a carrier;
   encapsulating at least part of the carrier and the electronic component by an encapsulant;
   punching at least one lead extending beyond the encapsulant; and
   sawing at least part of at least one side flank of the encapsulant,
   wherein the method comprises:
   mounting further electronic components on further carriers, so that the further electronic components and the further carriers are arranged in a plurality of rows and columns;
   encapsulating at least part of the further carriers and the further electronic components by further encapsulant;
   punching further leads extending beyond the further encapsulant;
   sawing further side flanks of the further encapsulant;
   connecting a clipframe to at least part of the carriers, wherein the clipframe comprises a plurality of clips between two adjacent columns; and
   separating the clipframe into the clips by punching a tie bar connecting adjacent clips.

2. The method according to claim 1, wherein the method comprises connecting carriers of at least one column by at least one tie bar, and subsequently singularizing into the plurality of packages by sawing through the at least one tie bar.

3. The method according to any of claim 1, wherein the method comprises carrying out the punching before the sawing.

4. The method according to claim 1, wherein the method comprises carrying out the sawing along a sawing direction perpendicular to an extension direction of each of the columns.

5. The method according to claim 1, wherein the method comprises testing the packages before the sawing, and in particular after the punching.

6. The method according to claim 1, wherein the method comprises one of the following:
   punching a plurality of leads by removing a continuous strip of material connecting the carriers; and
   punching a plurality of leads by removing a plurality of non-continuous sections of material connecting the carriers.

7. The method according to claim 1, wherein the method comprises arranging the leads in an interdigitate fashion.

8. The method according to claim 1, further comprising:
   providing at least one second lead extending away from an opposite side of the encapsulant as the at least one lead; and
   punching the least one second lead.

* * * * *

UNITED STATES PATENT AND TRADEMARK OFFICE
CERTIFICATE OF CORRECTION

| | | |
|---|---|---|
| PATENT NO. | : 12,165,959 B2 | Page 1 of 1 |
| APPLICATION NO. | : 17/150739 | |
| DATED | : December 10, 2024 | |
| INVENTOR(S) | : F. Singer et al. | |

It is certified that error appears in the above-identified patent and that said Letters Patent is hereby corrected as shown below:

In the Claims

Column 32, Line 47 (Claim 8) please change "the least" to -- the at least --

Signed and Sealed this
Eighteenth Day of February, 2025

Coke Morgan Stewart
*Acting Director of the United States Patent and Trademark Office*